US010502758B2

(12) United States Patent
Shiota et al.

(10) Patent No.: US 10,502,758 B2
(45) Date of Patent: Dec. 10, 2019

(54) INERTIA SENSOR AND METHOD OF MANUFACTURING THE SAME

(71) Applicant: Hitachi, Ltd., Tokyo (JP)

(72) Inventors: Takashi Shiota, Tokyo (JP); Tatsuyuki Saito, Tokyo (JP); Tatemi Ido, Tokyo (JP); Noriyuki Sakuma, Tokyo (JP); Yuudai Kamada, Tokyo (JP); Atsushi Isobe, Tokyo (JP); Chisaki Takubo, Tokyo (JP)

(73) Assignee: Hitachi, Ltd., Tokyo (JP)

(*) Notice: Subject to any disclaimer, the term of this patent is extended or adjusted under 35 U.S.C. 154(b) by 144 days.

(21) Appl. No.: 15/554,264

(22) PCT Filed: Nov. 9, 2016

(86) PCT No.: PCT/JP2016/083164
§ 371 (c)(1),
(2) Date: Aug. 29, 2017

(87) PCT Pub. No.: WO2017/158918
PCT Pub. Date: Sep. 21, 2017

(65) Prior Publication Data
US 2018/0238926 A1   Aug. 23, 2018

(30) Foreign Application Priority Data
Mar. 18, 2016  (JP) ................ 2016-055318

(51) Int. Cl.
*G01P 15/125* (2006.01)
*G01P 15/08* (2006.01)
*B81C 1/00* (2006.01)

(52) U.S. Cl.
CPC ........ *G01P 15/125* (2013.01); *B81C 1/00198* (2013.01); *G01P 15/0802* (2013.01); *G01P 2015/0862* (2013.01)

(58) Field of Classification Search
CPC ........ G01P 15/125; G01P 15/08; G01P 15/18; G01P 15/0802
See application file for complete search history.

(56) References Cited

U.S. PATENT DOCUMENTS

| 2002/0051258 A1 | 5/2002 | Tamura |
| 2009/0020419 A1 | 1/2009 | Suzuki et al. |

(Continued)

FOREIGN PATENT DOCUMENTS

| JP | 2002005950 | 1/2002 |
| JP | 2009027016 | 2/2009 |

(Continued)

OTHER PUBLICATIONS

International Search Report and Written Opinion of PCT/JP2016/083164.

*Primary Examiner* — Helen C Kwok
(74) *Attorney, Agent, or Firm* — Mattingly & Malur, PC

(57) ABSTRACT

Airtightness in a cavity of an inertial sensor (acceleration sensor) is increased to achieve high sensitivity. In the acceleration sensor having movable electrodes VE1, VE2 and fixed electrodes FE1, FE2, the fixed electrodes are formed by portions surrounded by a through hole TH1 provided in a cap layer CL, and the through hole is filled with an insulating film IF1 and polysilicon P and has a wide portion (WP). The wide portion has a gap SP that is not filled with the insulating film IF1 and the polysilicon P, and the gap SP is filled with the interlayer insulating film ID. With such a configuration, degassing can be exhausted through the gap (airway) SP in a pressure reducing step.

20 Claims, 35 Drawing Sheets

(56) References Cited

U.S. PATENT DOCUMENTS

| | | | |
|---|---|---|---|
| 2010/0065858 A1* | 3/2010 | Sugiura | B81C 1/00238 257/81 |
| 2010/0176466 A1* | 7/2010 | Fujii | B81B 7/007 257/415 |
| 2012/0025333 A1* | 2/2012 | Yoshida | B81C 1/00587 257/415 |
| 2012/0119311 A1 | 5/2012 | Esfahany et al. | |
| 2013/0269434 A1* | 10/2013 | Kamisuki | G01P 15/125 73/514.32 |
| 2014/0007685 A1* | 1/2014 | Zhang | G01P 15/125 73/514.32 |
| 2015/0040667 A1* | 2/2015 | Tanaka | G01P 15/125 73/514.32 |
| 2015/0102437 A1 | 4/2015 | Liu et al. | |
| 2015/0313016 A1* | 10/2015 | Naruse | G01P 1/023 73/488 |
| 2016/0016788 A1* | 1/2016 | Yoshioka | G01P 15/0802 257/415 |
| 2016/0223582 A1* | 8/2016 | Sakai | G01P 15/125 |
| 2017/0192033 A1* | 7/2017 | Yoshida | G01P 15/125 |
| 2017/0233246 A1* | 8/2017 | Kanamaru | G01P 15/08 257/417 |

FOREIGN PATENT DOCUMENTS

| | | |
|---|---|---|
| JP | 2011255436 | 12/2011 |
| JP | 2015077677 | 4/2015 |
| JP | 2015207727 | 11/2015 |

\* cited by examiner

FIG. 9
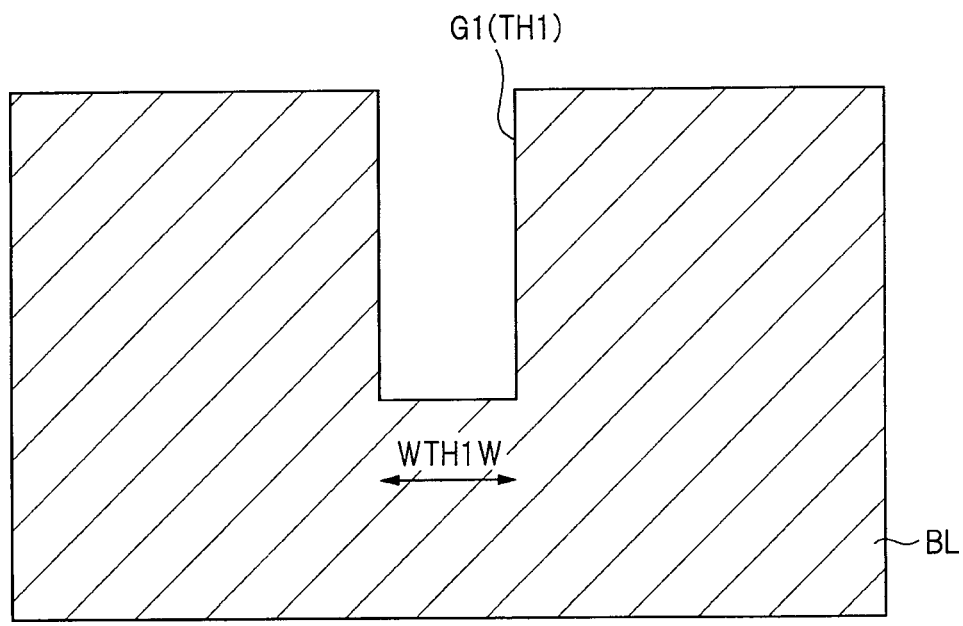
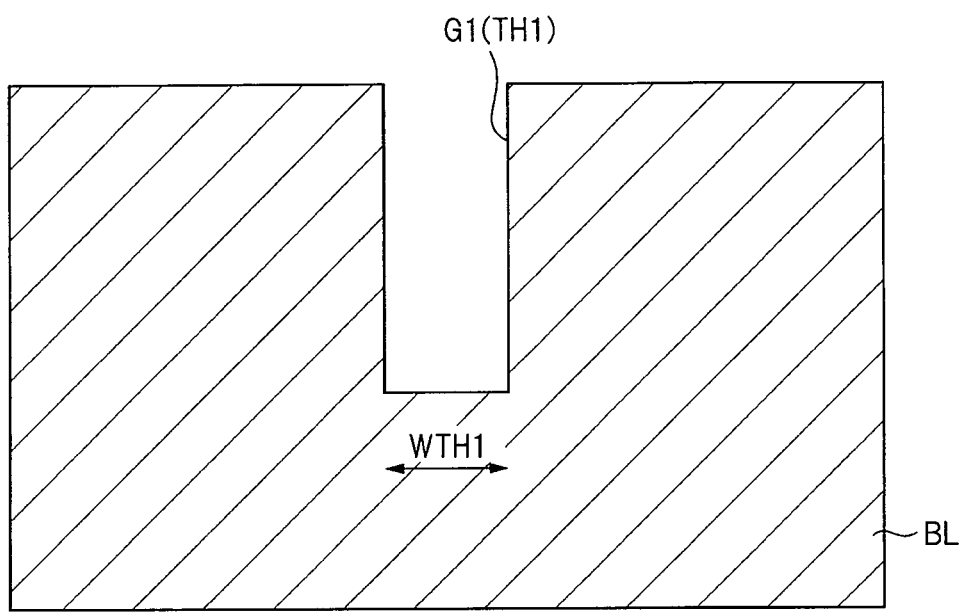

FIG. 10
(A)
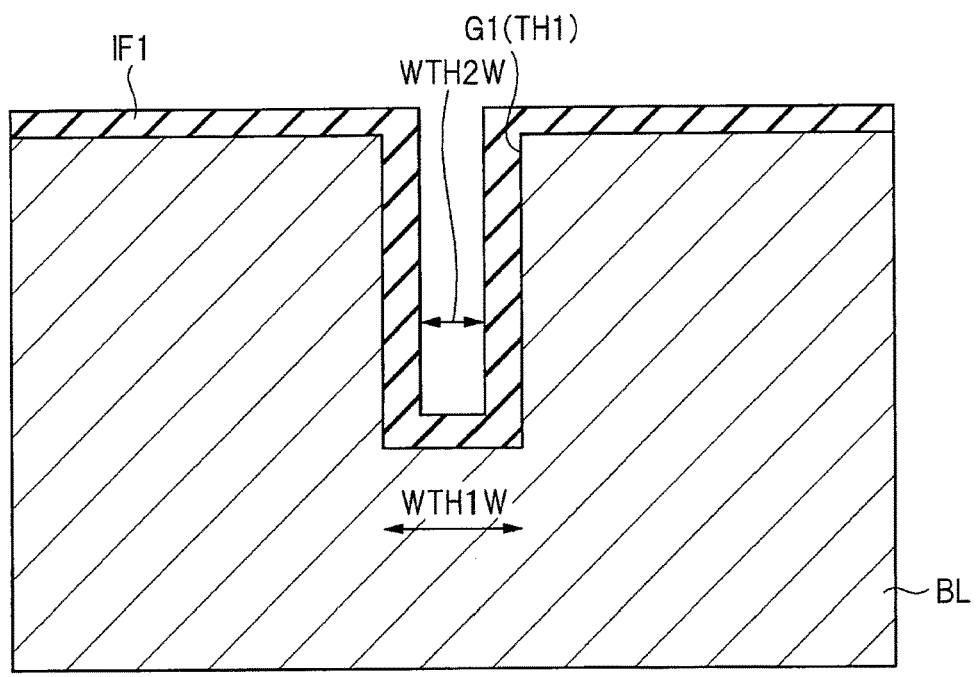
(B)
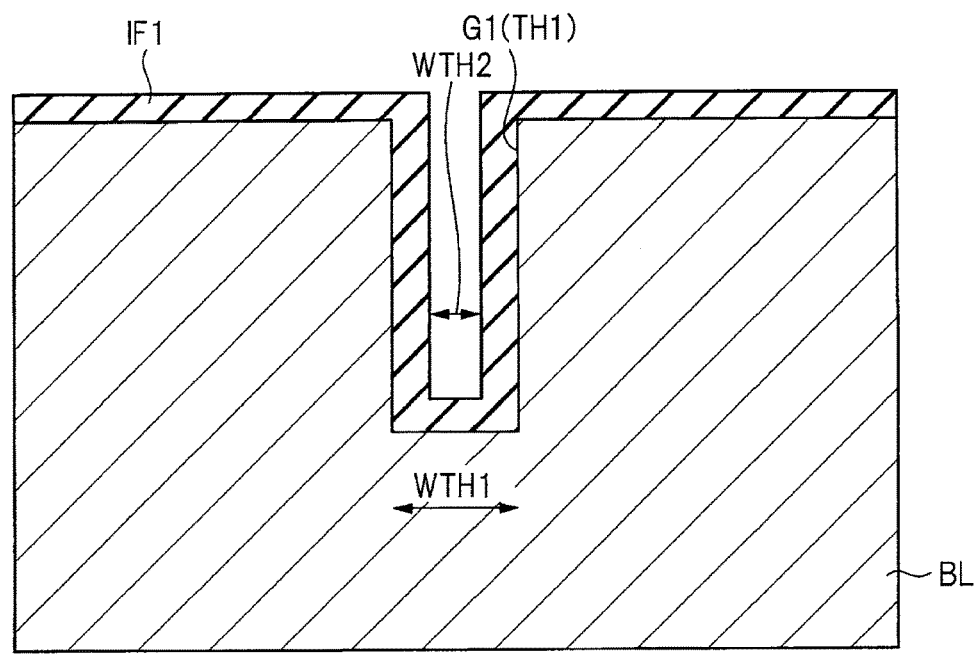

FIG. 11
(A)
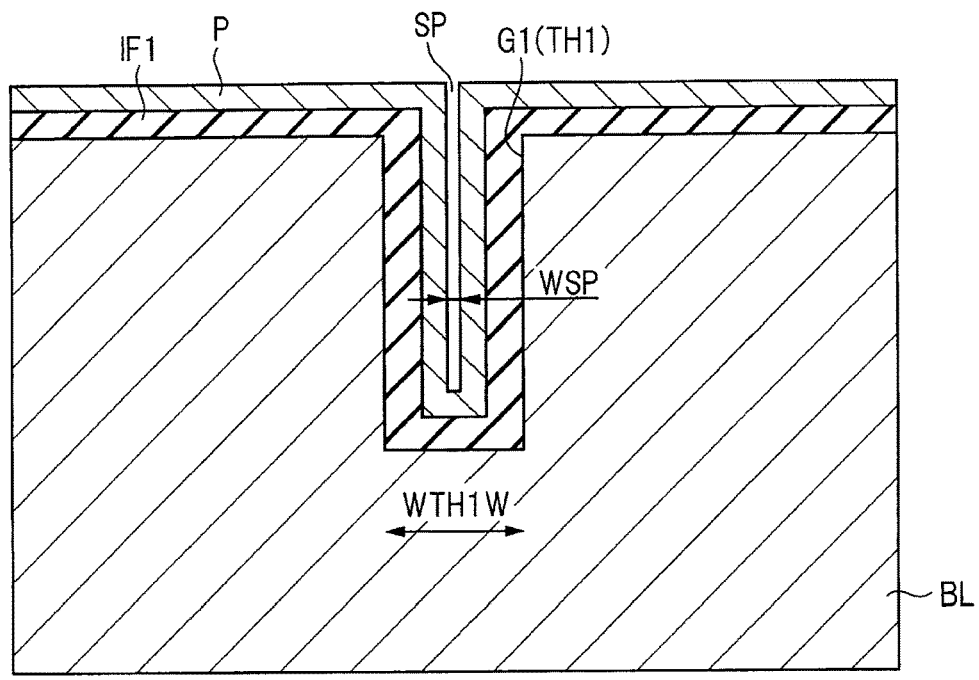
(B)
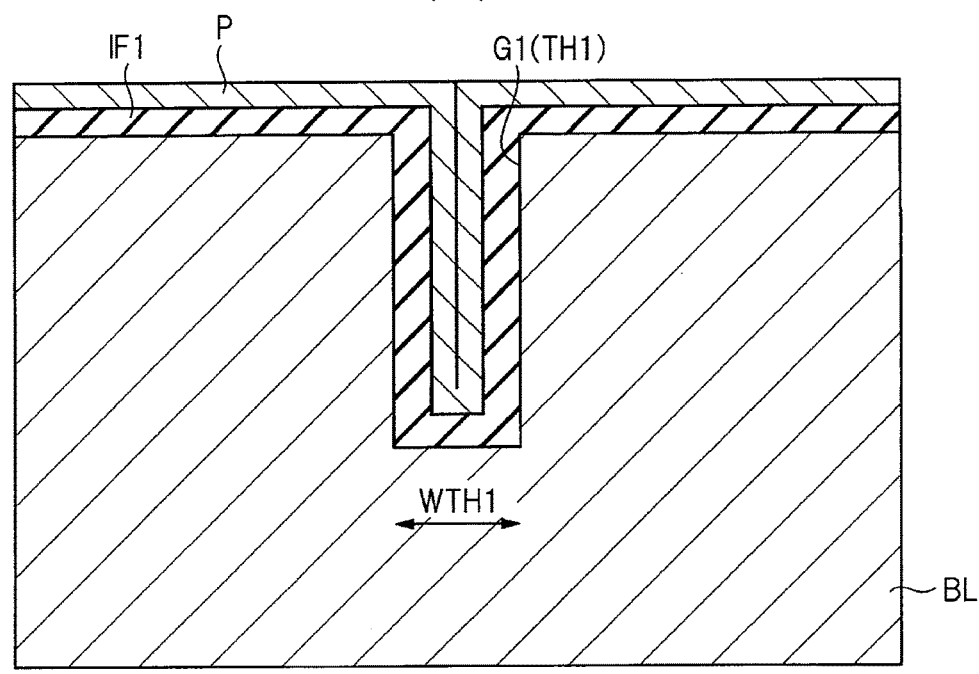

FIG. 12
(A)
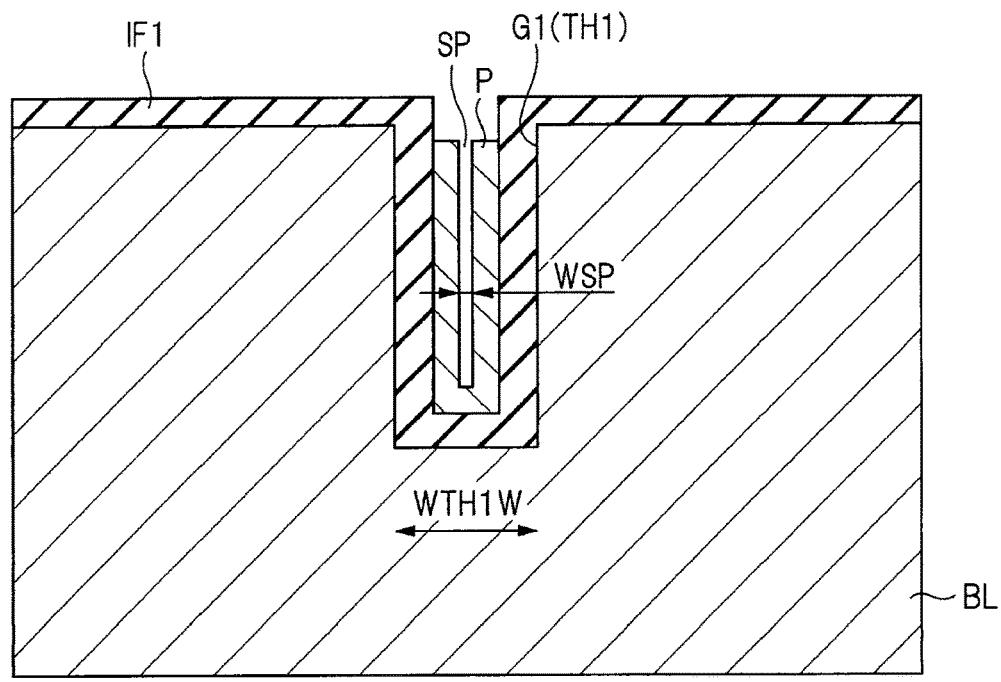
(B)
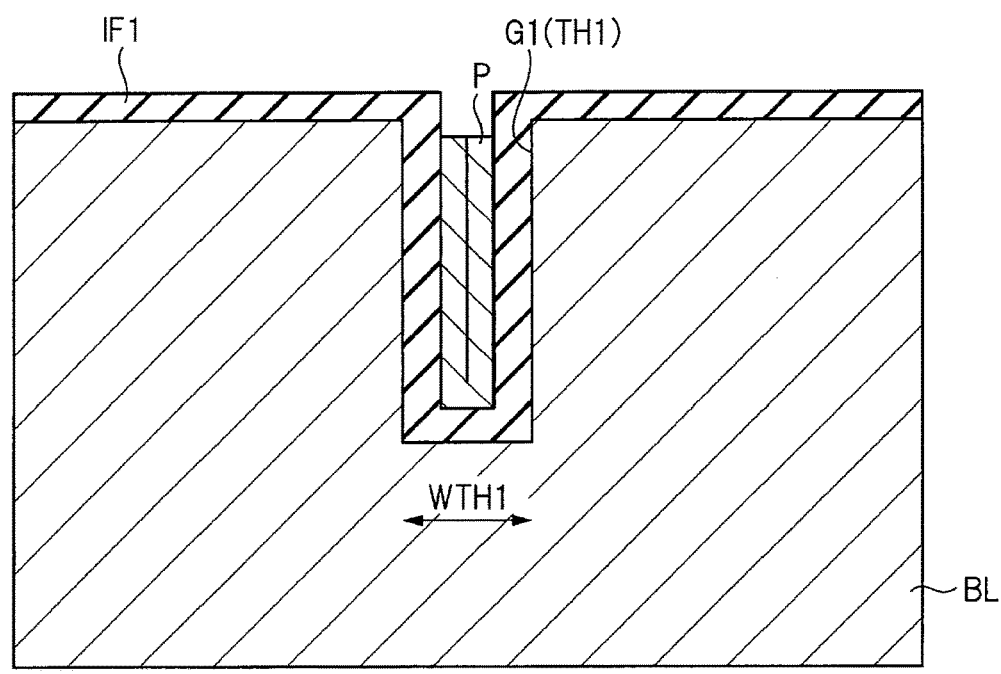

FIG. 13
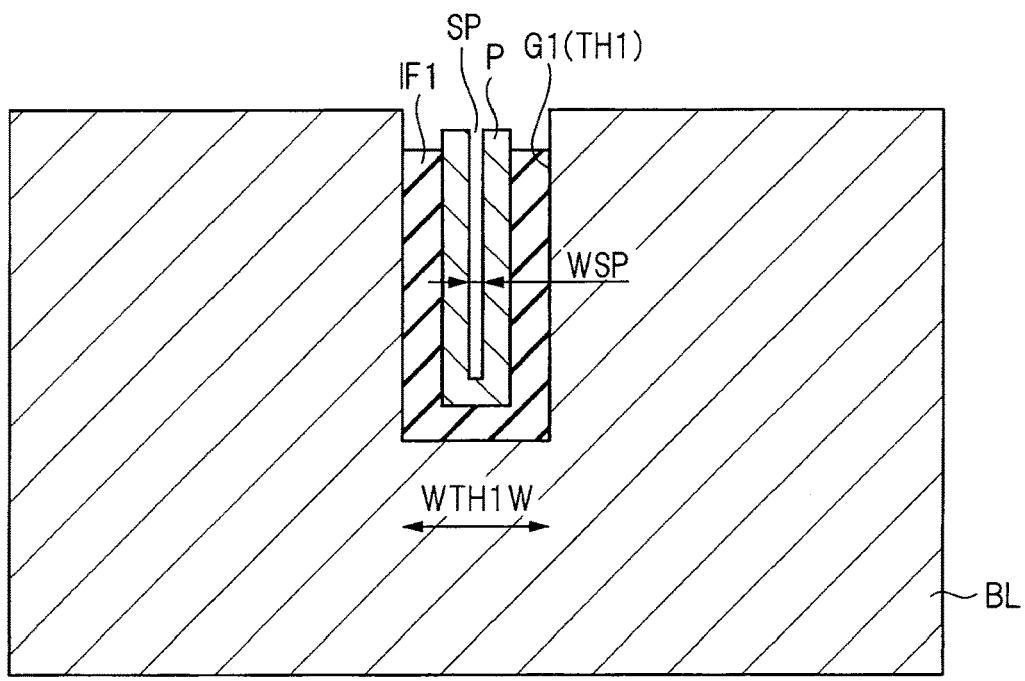
(A)
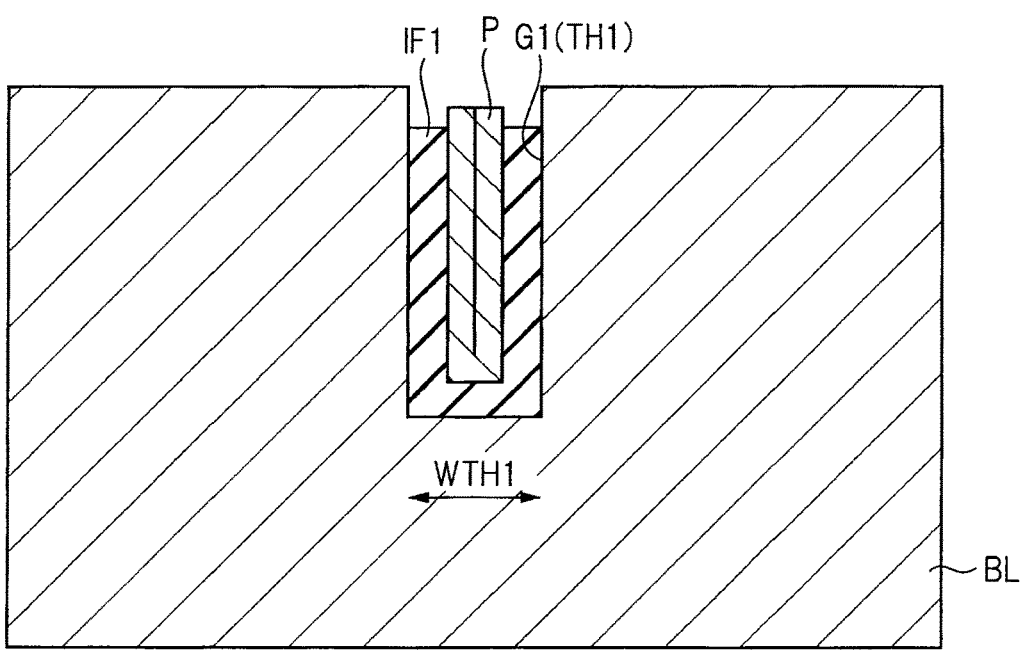
(B)

INERTIA SENSOR AND METHOD OF MANUFACTURING THE SAME

TECHNICAL FIELD

The present invention relates to an inertial sensor, for example, an acceleration sensor for detecting minute acceleration smaller than gravity.

BACKGROUND ART

Japanese Unexamined Patent Application Publication No. 2011-255436 (Patent Literature 1) discloses a technique in which a penetrating electrode structure insulated and isolated from a surrounding is provided by surrounding an electrode of MEMS (Micro Electrical Mechanical Systems) with a through trench. Further, Patent Literature 1 discloses a technique for improving airtightness of the MEMS by filling the through trench with a first growth film and a second growth film.

CITATION LIST

Patent Literature

Patent Literature 1: Japanese Unexamined Patent Application Publication No. 2011-255436

SUMMARY OF INVENTION

Technical Problem

A reflection seismic survey is directed to a method in which a reflected wave obtained by causing a shock wave or a continuous wave to be generated on the ground, be reflected from an underground reflective surface (a boundary surface where an acoustic impedance changes) and return to the ground, is measured and analyzed with a geophone expanded on the ground to explore a depth distribution of an underground reflective surface and a subsurface structure. For example, the reflection seismic survey is widely used as a main exploration method of oil and natural gas. In particular, attention is paid to an acceleration sensor that detects vibration acceleration which is much smaller than the gravitational acceleration as a next generation reflection seismic survey sensor. In order to put such an acceleration sensor in practical use, development of a sensitive acceleration sensor low in noise and very high in sensitivity has been desired.

For example, the acceleration sensor has a mass body that functions as a movable electrode and a fixed electrode that is disposed at a position facing the mass body. The acceleration sensor detects acceleration based on a capacitance change in electrostatic capacitance of the mass body and the fixed electrode due to a displacement of the mass body when acceleration is applied.

In order to realize such high sensitivity (improvement of an S/N ratio) of the acceleration sensor, there is a need to increase a mass of the mass body and reduce a spring constant of the mass body. Also, in order to reduce a mechanical noise there is a need to provide an opening in the mass body to reduce air resistance and furthermore to seal the inside of the cavity in which the mass body is disposed at a pressure sufficiently lower than the atmospheric pressure.

However, as a result of investigation by the present inventor, even if a wafer having a concave portion that serves as a hollow portion is joined in a reduced-pressure atmosphere in order to hermetically seal the cavity, a pressure in the cavity rises and the sensitivity of the acceleration sensor is deteriorated due to a heat load applied in a heat treatment process at the time of joining and a process (for example, wiring process) after joining.

An object of the present invention is to provide a technique for maintaining a pressure reduced state in a cavity of an inertial sensor and increasing the sensitivity of the inertial sensor.

Other problems and novel features will become apparent from a description of the present specification and the accompanying drawings.

Solution to Problem

An inertia sensor according to one embodiment includes a movable electrode and a fixed electrode, the fixed electrode is configured by a portion surrounded by a through hole provided in a layer, and the through hole is filled with a first film and has a wide portion. The wide portion has a gap not filled with the first film, and the gap is filled with a second film.

A method of manufacturing an inertia sensor according to another embodiment includes: (a) a step of joining a second layer on a first layer having a first concave portion, and (b) a step of forming a fixed portion that is fixed to the first layer and a movable electrode that is connected to the fixed portion and disposed on the first concave portion, by patterning the second layer. The method also includes a step of (c) preparing a third layer that has a second concave portion, a trench that is formed in a bottom surface of the second concave portion and surrounds a part of the bottom surface of the second concave portion, and a first film that is embedded in the trench, the trench having a wide portion, and has a gap that is not filled with the first film in the wide portion. The method further includes (d) a step of joining the second layer and the third layer to each other in a state where a first cavity is provided to be surrounded by the first concave portion and the second concave portion, and the movable electrode is disposed in the first cavity, and (e) a step of removing a surface of the second layer opposite to a formation surface of the second concave portion until the gap is exposed, and (f) after the step (e), a step of forming a second film on the surface of the second layer opposite to the formation surface of the second concave portion. The step (f) includes: (f1) a step of reducing a pressure of the first cavity to a first pressure lower than at least an atmospheric pressure, and (f2) a step of forming the second film at a second pressure lower than at least the atmospheric pressure.

Advantageous Effects of Invention

According to one embodiment, the characteristics of the inertial sensor can be improved. In addition, according to the method of manufacturing the inertial sensor in another embodiment, an inertial sensor with excellent characteristics can be manufactured.

BRIEF DESCRIPTION OF DRAWINGS

FIG. 9 are cross-sectional views showing the process of manufacturing the acceleration sensor according to the first embodiment.

FIG. 10 are cross-sectional views showing the process of manufacturing the acceleration sensor according to the first embodiment.

FIG. 11 are cross-sectional views showing the process of manufacturing the acceleration sensor according to the first embodiment.

FIG. 12 are cross-sectional views showing the process of manufacturing the acceleration sensor according to the first embodiment.

FIG. 13 are cross-sectional views showing the process of manufacturing the acceleration sensor according to the first embodiment.

DESCRIPTION OF EMBODIMENTS

The following embodiment is described by splitting the same into a plurality of sections or embodiments as necessary for convenience's sake. However, it is to be understood that those sections or embodiments are not unrelated to each other unless explicitly stated otherwise, and one thereof represents a part of the other thereof, a variation of the other in whole, or details, supplemental remarks, and so forth.

Further, in the case where reference is made to the number, and so forth (including the number of units, a numerical value, quantity, scope, and so forth) as to elements of the following embodiment of the present invention, the present invention is not limited to a specified number, but the number, and so forth may be either not less than the specified number, or not more than the specified number unless explicitly stated otherwise, and unless obviously limited to the specified number on a theoretical basis.

Further, constituent elements (including a step as an element, and so forth) of the following embodiment are not always essential unless explicitly stated otherwise, and unless obviously considered essential on a theoretical basis.

Similarly, when mention is made of respective shapes of constituent elements, and so forth, and position relation between the constituent elements, and so forth, in the following embodiment, the shapes, and so forth include those effectively approximate, or analogous thereto unless explicitly state otherwise, and unless obviously considered otherwise on a theoretical basis. The same can be said of the numeral value, and the scope, described as above.

Note that components having the same function are denoted by the same reference symbols throughout the drawings for describing the embodiments, and the repetitive description thereof will be omitted. Also, in some drawings used in the following embodiments, hatching is omitted even in a plan view so as to make the structure easy to see.

First Embodiment

<Examples of Field of Application of Acceleration Sensor>

Acceleration sensors are used in a wide range of fields such as attitude control of automobiles, smartphones, game machines. The acceleration sensors used in those fields are compact, and can detect acceleration having a magnitude of several times the gravity in a low frequency band of several hundred Hz or less.

On the other hand, in recent years, the field of application of the acceleration sensors is not limited to the abovementioned fields but expands to the field of exploration of geological resources. In the field of exploration of the geological resources, a reflection method elastic wave exploration (reflection method seismic survey) that is one type of the geophysical exploration is a technique in which, after a seismic wave has been artificially generated, the reflected wave bouncing off the underground is grasped by a geophone (acceleration sensor) installed on the ground surface, and the result is analyzed to clarify a underground structure.

Figure 1:
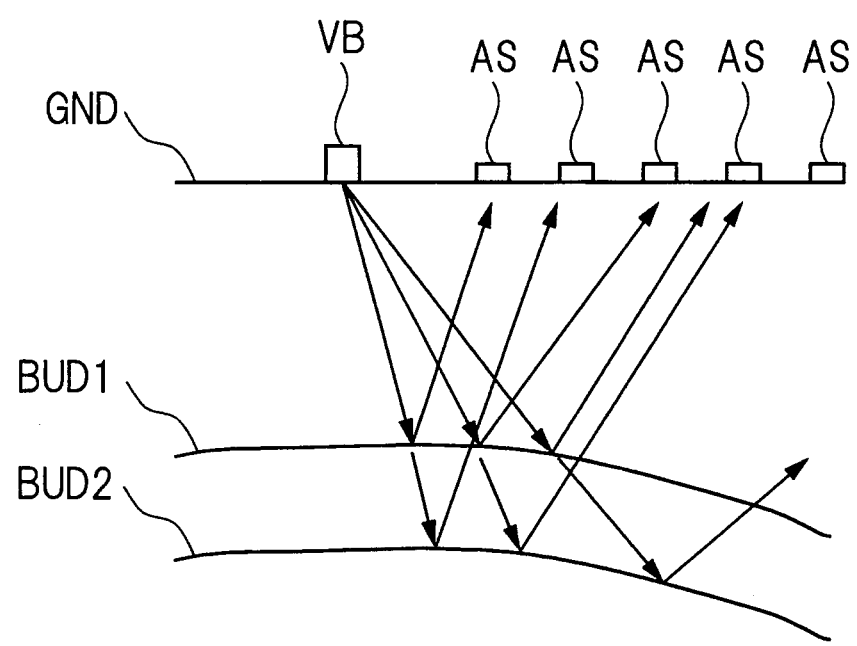
FIG. 1 is a schematic cross-sectional view of the ground showing an outline of a reflection method elastic wave exploration.

FIG. 1 is a schematic cross-sectional view of a ground surface showing an outline of the reflection method elastic wave exploration. In FIG. 1, after elastic waves (arrows in the figure) have propagated from a vibration source VB installed at a ground surface GND into the ground, the elastic wave reflected by a boundary BUD1 and a boundary BUD2 of a plurality of strata is sensed by an acceleration sensor (geophone sensor) AS installed at the ground surface GND. Because the general vibration source VB oscillates in a direction perpendicular to the ground surface, the P waves are efficiently excited in a direction close to the vertical direction. For that reason, the P waves are used in the reflection method elastic wave exploration. The elastic waves returned to the ground surface GND again are the P waves propagating from a direction close to the vertical direction, therefore it is necessary for the acceleration sensor AS to detect elastic vibration in the vertical direction. As shown in FIG. 1, the elastic waves excited in various directions propagate through the ground having large attenuation, reflect at the boundary BUD1 and the boundary BUD2 of the plurality of strata, again propagate through the ground with large attenuation, diffuse into a wide area, and return to the ground surface GND.

In this way, in the reflection method elastic wave exploration, in order to detect weak elastic vibration, it is necessary for the acceleration sensor AS to be highly sensitive in the vertical direction. Specifically, because the acceleration of weak elastic vibration is smaller than the gravitational acceleration, the acceleration sensor used for the reflection method elastic wave exploration is required to detect the acceleration smaller than the gravitational acceleration with high sensitivity.

From the above fact, from the viewpoint of detecting the acceleration smaller than the gravitational acceleration with high sensitivity (improving the S/N ratio), the acceleration sensor according to the present embodiment employs a configuration in which a mass of a mass body (also called detection mass) that is a component of the acceleration sensor is increased, and a spring constant is reduced, and a configuration in which a cavity in which the mass body is disposed is sealed in a reduced pressure state in order to reduce the mechanical noises. However, as described above, it has been provided by the present inventors' study that it is very difficult to maintain a pressure reduced state in the cavity portion. Therefore, in the present embodiment, a configuration of the acceleration sensor and a method for manufacturing the acceleration sensor capable of maintaining the pressure reduced state in the cavity will be described.

[Description of Structure]

Figure 2:
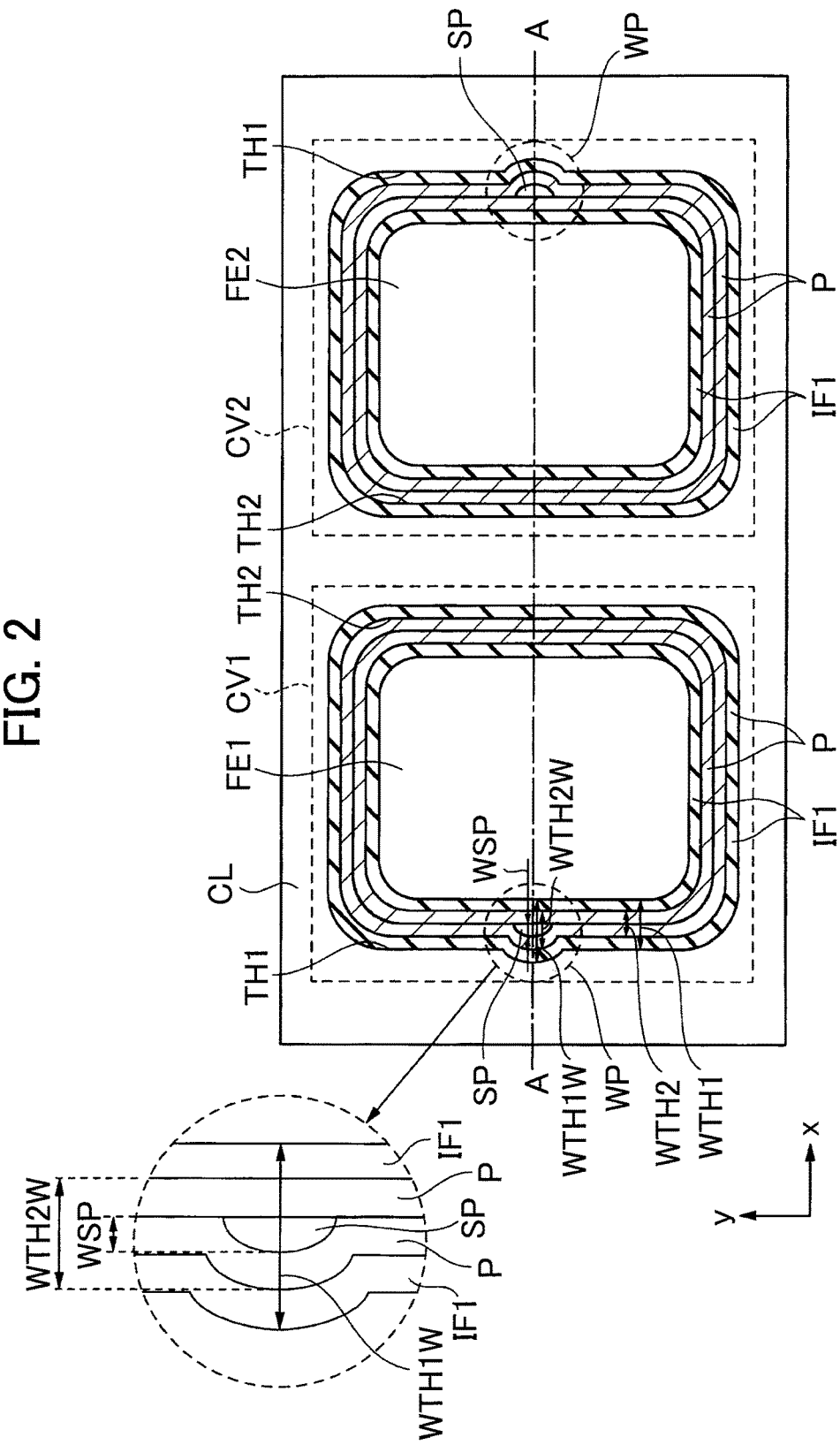
FIG. 2 is a plan view showing a configuration of an acceleration sensor according to a first embodiment.
Figure 3:
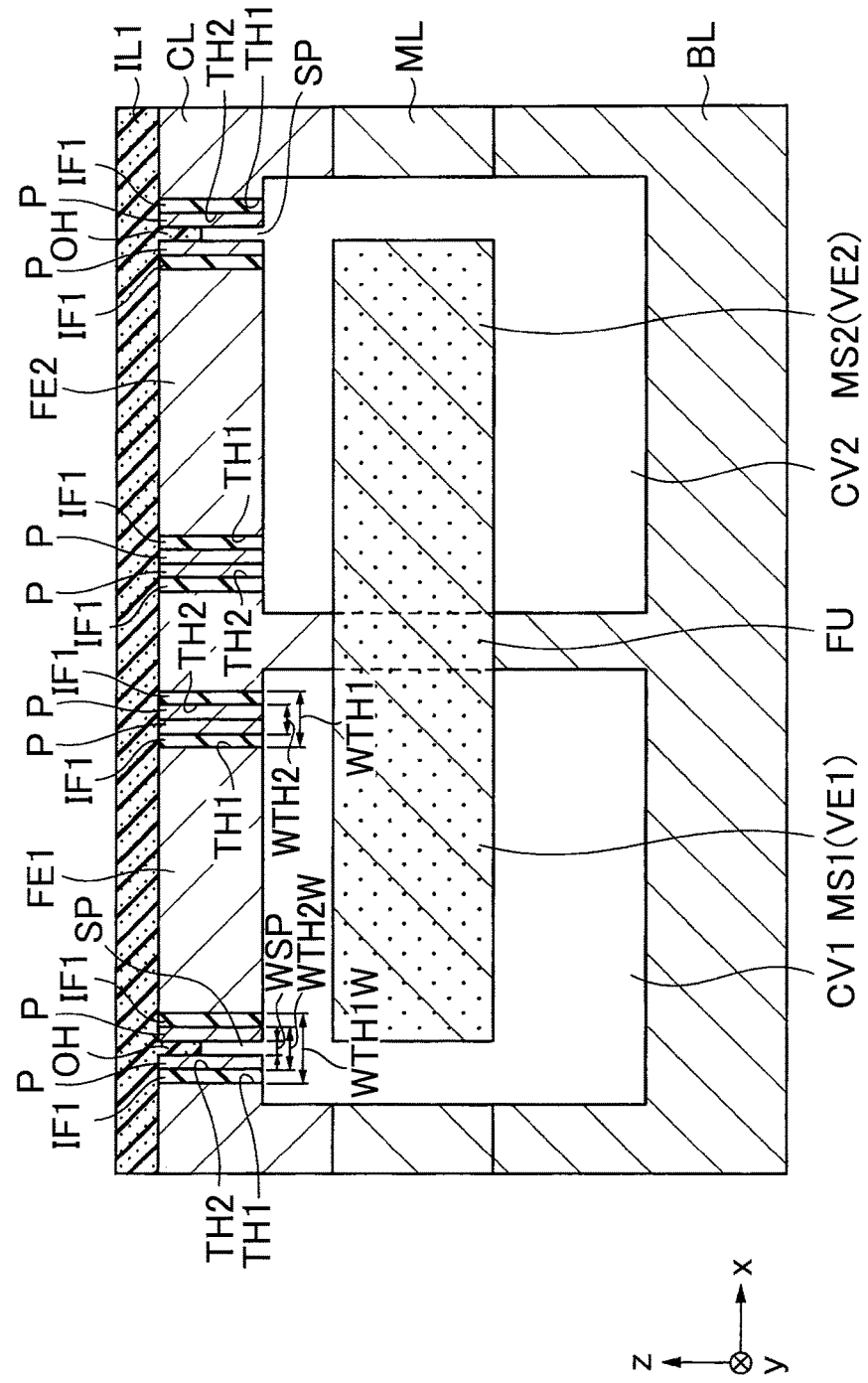
FIG. 3 is a cross-sectional view showing the configuration of the acceleration sensor according to the first embodiment.
Figure 4:
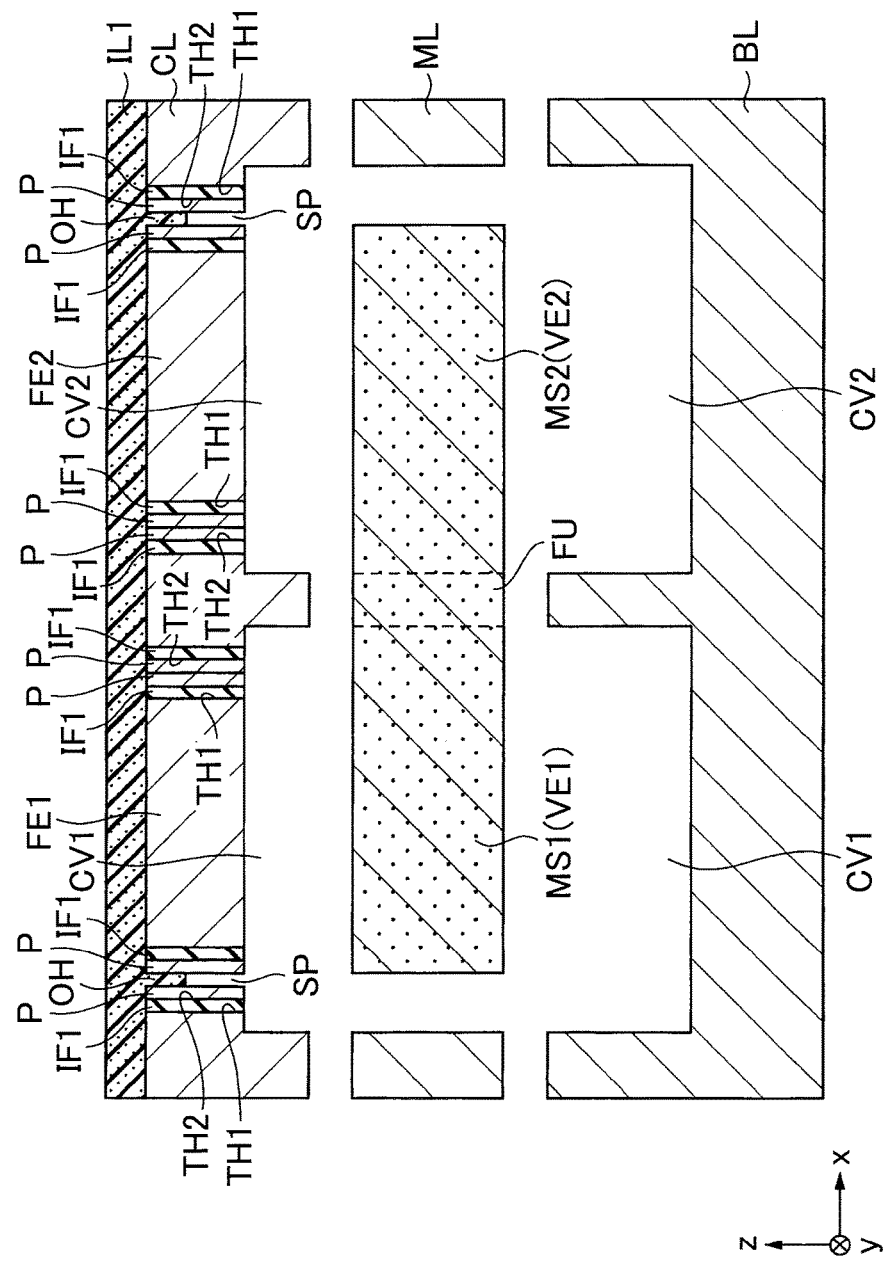
FIG. 4 is an exploded cross-sectional view showing the configuration of the acceleration sensor according to the first embodiment.
Figure 5:
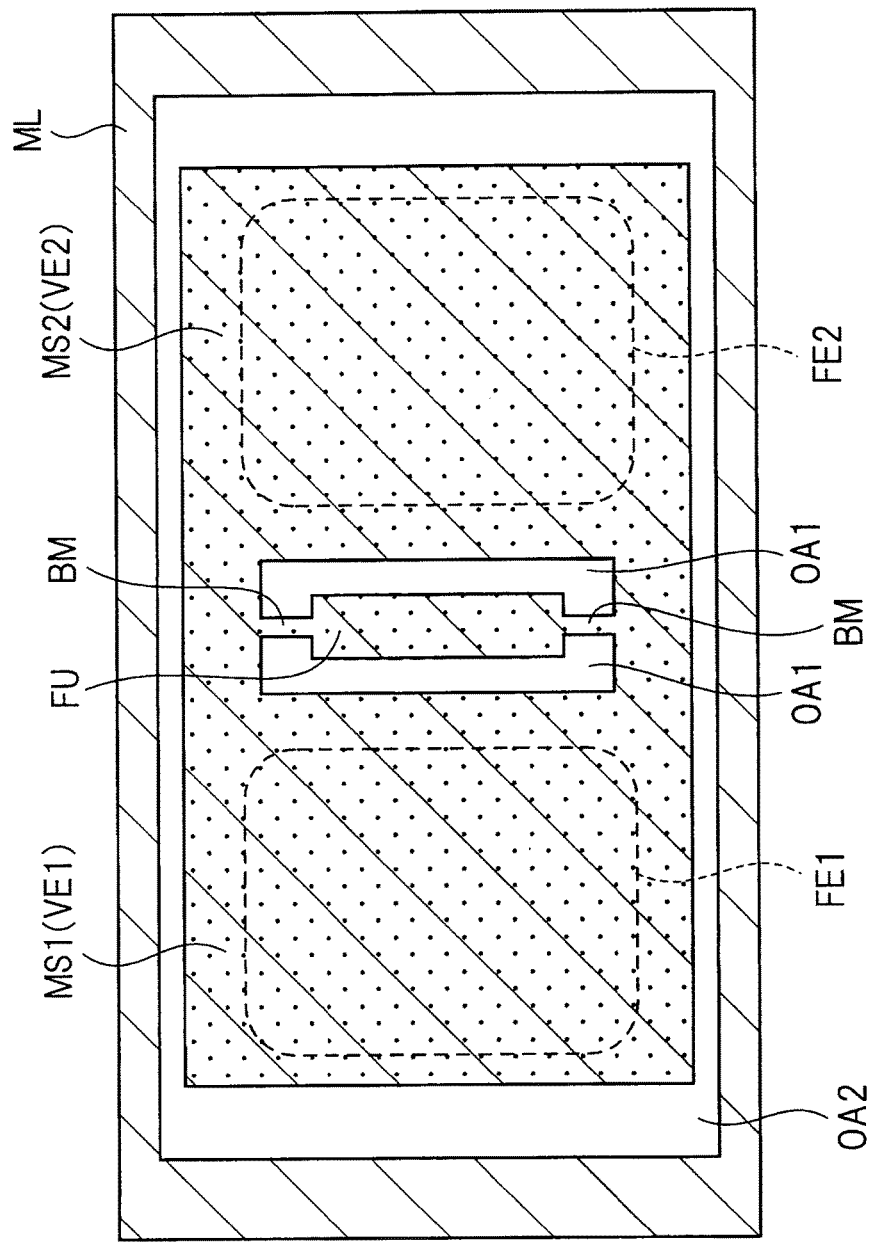
FIG. 5 is a plan view showing the configuration of the acceleration sensor according to the first embodiment.
Figure 6:
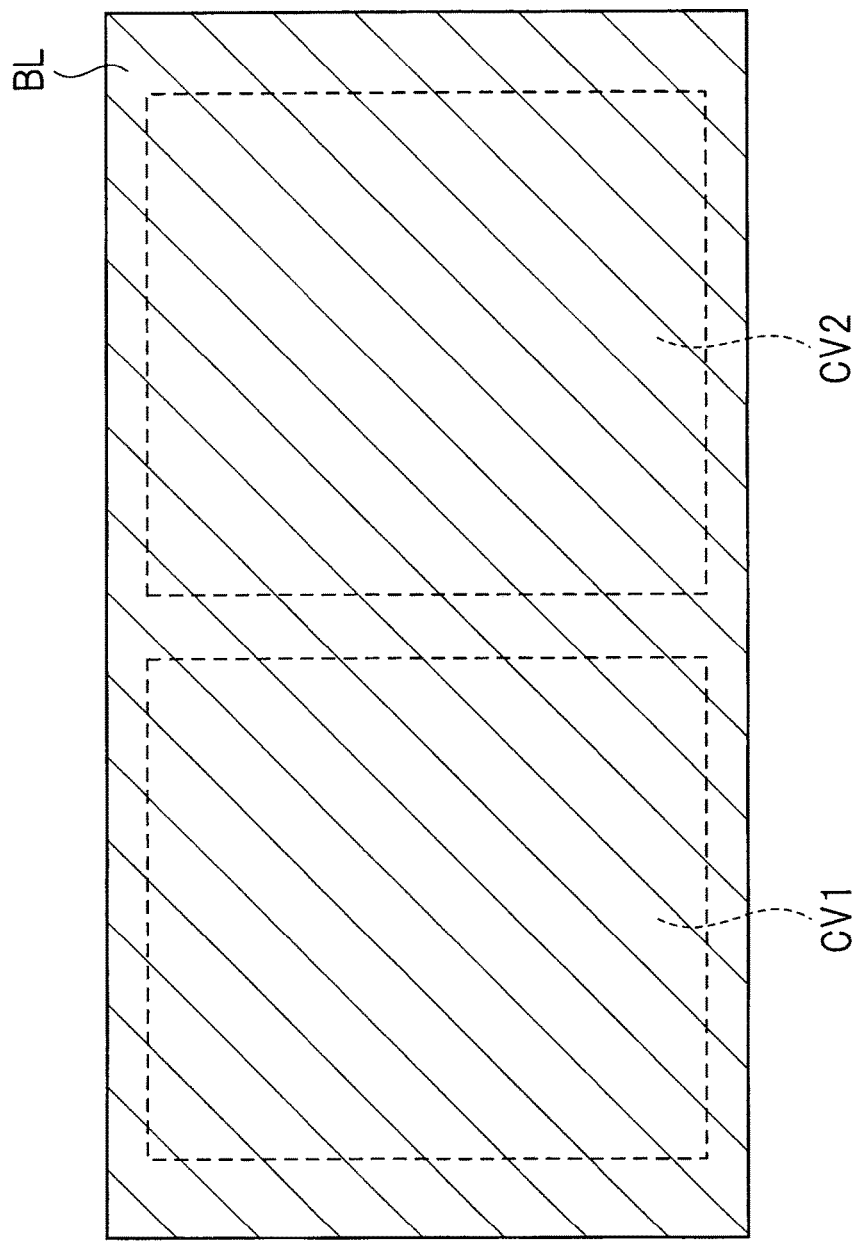
FIG. 6 is a plan view showing the configuration of the acceleration sensor according to the first embodiment.

FIGS. 2 and 3 are a plan view and a cross-sectional view showing the configuration of the acceleration sensor according to the present embodiment. For example, a cross-section taken along a line AA in FIG. 2 corresponds to FIG. 3. FIG. 4 is an exploded cross-sectional view showing the configuration of the acceleration sensor according to the present embodiment. In addition, FIGS. 5 and 6 are plan views showing the configuration of the acceleration sensor according to the present embodiment. FIG. 5 is a plan view of an MEMS layer ML viewed from a top surface, and FIG. 6 is a plan view of a base layer BL viewed from the top surface. Meanwhile, FIG. 2 is a plan view of a portion of a cap layer CL below an interlayer insulating film IL1 as viewed from above.

As shown in FIGS. 3 and 4, the acceleration sensor according to the present embodiment has three layers (cap layer CL, MEMS layer ML, base layer BL). The cap layer CL and the base layer BL have concave portions. In the acceleration sensor according to the present embodiment, a fixed portion FU (mass bodies MS1 and MS2) provided in the MEMS layer ML is sandwiched between the cap layer CL and the base layer BL.

As shown in FIGS. 3, 4 and 6, the base layer BL has a concave portion serving as a cavity CV1 and a concave portion serving as a cavity CV2. A convex portion of a boundary portion between those convex portions is a portion joined to a fixe portion FU of the MEMS layer ML. An outer periphery of those two concave portions forms a frame portion (frame) joined to the MEMS layer ML. The base layer BL is made of, for example, silicon (Si). The concave portion can be formed by, for example, etching silicon.

As shown in FIGS. 3, 4, and 5, the MEMS layer ML has mass members MS1 and MS2. The fixed portion FU between those mass members is a portion that is sandwiched between a convex portion of the base layer BL and a convex portion of the cap layer CL. The mass body MS1 is disposed in the cavity CV1 and the mass body MS2 is disposed in the cavity CV2. Although not shown in FIG. 5, a plurality of openings penetrating through the mass bodies MS1 and MS2 may be provided (refer to FIG. 31). In this way, with provision of the openings in the mass bodies MS1 and MS2, air resistance can be reduced, and mechanical noise can be reduced. The MEMS layer ML is made of, for example, silicon (Si). Processing of the mass bodies MS1, MS2, the fixed portion FU, and so on can be performed by, for example, etching silicon. Also, the fixed portion FU connected to the mass bodies MS1 and MS2 is sandwiched between the convex portion of the base layer BL and the convex portion of the cap layer CL which will be described later, but both ends of the fixed portion FU are not fixed but can be displaced in a z-direction in FIG. 3. Symbol BM is a beam connecting the mass bodies MS1, MS1 and the fixed portion FU. In this way, the mass bodies MS1 and MS2 is made of conductive silicon and can be displaced in the z direction, and therefore function as movable electrodes VE1 and VE2. Therefore, in the acceleration sensor according to the present embodiment, the fixed electrodes FE1 and FE2 formed on the base layer BL and the mass bodies MS1 and MS2 (movable electrodes VE1, VE2) formed on the MEMS layer ML perform capacitances. As described above, the advantage of detecting the acceleration by the two capacitances will be described later (refer to a second application of a second embodiment).

As shown in FIGS. 2, 3 and 4, the cap layer CL has a concave portion serving as a cavity CV1 and a concave portion serving as a cavity CV2, and a convex portion of a boundary portion between those concave portions is a portion joined to the fixed portion FU of the MEMS layer ML. In addition, an outer periphery of the two concave portions serves as a frame portion (frame) to be joined with the MEMS layer ML. Further, the cap layer CL has the fixed electrode FE1 and the fixed electrode FE2. The fixed electrode FE1 is disposed at a bottom of the concave portion serving as the cavity CV1, and the fixed electrode FE2 is disposed at a bottom of the concave portion serving as the cavity CV2. The cap layer CL is joined to the MEMS layer ML such that the two concave portions are placed on the lower side, and therefore the fixed electrodes FE1 and FE2 are disposed on the upper surface side of the acceleration sensor.

As shown in FIGS. 2 and 3, the fixed electrodes FE1 and FE2 are surrounded by the through hole TH1 and electrically separated from the other regions. Both sides of the through hole TH1 are filled with an insulating film IF1, and the inside of the insulating film IF1 is filled with polysilicon P. Such a filled structure of the through holes may be referred to as "TSV (through silicon via) structure" in some cases.

In this example, as shown in FIG. 2, a width of the through hole TH1 is not uniform, and the through hole TH1 partially has a wide portion (singular point) WP. Specifically, a wide portion WP of the through hole TH1 is "WTH1W" in width, the other portion is "WTH1" in width, and a relationship of WTH1W>WTH1 is met.

For that reason, in the through hole TH1, in the region other than the wide portion WP, the inside of the through hole TH1 is filled with the insulating film IF1 and the polysilicon P, whereas in the wide portion WP, gaps (airways) SP are disposed in the polysilicon P (refer to FIGS. 2 and 3). Hence, in the cross-section of the through hole TH1, the insulating film IF1, the polysilicon P, the polysilicon P, and the insulating film IF1 are disposed from one side in the stated order. On the other hand, in the cross section of the wide portion WP of the through hole TH1, the insulating film IF1, the polysilicon P, the gap SP, the polysilicon P, and the insulating film IF1 are disposed in the stated order.

An interlayer insulating film IL1 is disposed on the fixed electrodes FE1 and FE2 surrounded by the through hole TH 1. A part of the interlayer insulating film IL1 enters the gap SP of the wide portion WP (refer to the OH portion in FIG. 3). In other words, the gap SP of the wide portion WP is filled with the interlayer insulating film IL1.

[Description of Operation]

Next, the operation of the acceleration sensor according to the present embodiment will be described.

The acceleration sensor according to the present embodiment is an acceleration sensor that captures the acceleration applied in the z direction as a capacitance change of a variable capacitance formed by the movable electrodes VE1, VE2 and the fixed electrodes FE1, FE2.

First, a modulation signal is applied to the variable capacitance configured by the movable electrodes VE1, VE2 and the fixed electrodes FE1, FE2. With the application of the modulation signal in this manner, the S/N ratio can be improved. For example, the acceleration can be detected by detecting the change in the capacitance at the variable capacitance caused by the acceleration without supplying the modulation signal. However, because the detection signal based on the capacitance change in the variable capacitance corresponding to the acceleration is a low frequency signal, the detection signal is susceptible to 1/f noise. In other words, in the configuration in which the detection signal based on the capacitance change in the variable capacitance corresponding to the acceleration is used as it is, the 1/f noise becomes large, as a result of which the S/N ratio deteriorates and the detection sensitivity of the acceleration sensor decreases. Therefore, in the present embodiment, the modulation signal is used. In this case, because the detection signal based on the capacitance change in the variable capacitance corresponding to the acceleration is modulated by the modulation signal to become a high frequency signal, the detection signal is less susceptible to the 1/F noise. In other words, since the 1/f noise becomes smaller than the low frequency signal in the high frequency signal, the S/N ratio can be improved. As a result, the detection sensitivity of the acceleration sensor can be improved.

Then, for example, it is assumed that acceleration is applied in the z direction. In this case, the mass bodies MS1 and MS2 having the movable electrodes VE1 and VE2 are displaced in the z direction. As a result, a change in the capacitance of the variable capacitance configured by the movable electrodes VE1, VE2 and the fixed electrodes FE1, FE2 occurs. The capacitance change is output to the signal processing circuit in addition to the modulation signal. More specifically, in the signal processing circuit, the modulation signal to which the capacitance change caused by the acceleration is added is input to the CV conversion unit, and the capacitance change is converted into an analog voltage signal. Then, the converted analog voltage signal is converted into a digital voltage signal by an AD conversion unit. Thereafter, the converted signal is extracted by a synchronous detection unit. Subsequently, the demodulated signal demodulated by the synchronous detection unit passes through an LPF (low frequency band pass filter), and the acceleration signal (detection signal) corresponding to the acceleration is finally output from an output terminal. As described above, the acceleration in the z direction can be detected. The advantage of detecting the acceleration by the two capacitances will be described later (refer to application 2 of the second embodiment).

[Manufacturing Method]

Next, a method of manufacturing the acceleration sensor according to the present embodiment will be described, and the configuration of the acceleration sensor will be more clarified. FIGS. 7 to 22 are cross-sectional views or plan views showing a process of manufacturing the acceleration sensor according to the present embodiment.

First, referring to FIG. 4, a process of forming the base layer BL will be described. For example, a silicon wafer is prepared as a semiconductor substrate (semiconductor wafer). Next, with the use of a photolithography technique and an etching technique, two concave portions to be the cavities CV1 and CV2 are formed on an upper surface of the silicon wafer. A convex portion at a boundary portion between the two concave portions is a portion to be joined with the fixed portion FU of the MEMS layer ML. In addition, a frame portion (frame) around the two concave portions becomes a bonding portion (connecting portion) to which the cap layer CL is bonded through the MEMS layer ML.

Next, the MEMS layer ML is formed on the base layer BL. For example, a silicon wafer is bonded (joined) as a semiconductor substrate (semiconductor wafer) onto the convex portion and the frame portion of the base layer (silicon wafer) BL. As the bonding process (joining process), a direct bonding method in which the wafers are brought into close contact with each other and bonded together may be used, or an indirect bonding method in which wafers are bonded using an adhesive or the like may be used. Note that an SOI (Silicon on Insulator) substrate may be used as the semiconductor substrate. Next, a surface of the silicon wafer is polished. For example, polishing is carried out such that a thickness of the silicon waver is about 250 μm. Next, the thinned silicon wafer (silicon layer) is patterned by using the photolithography technique and the dry etching technique. Specifically, openings OA1 and OA2 are provided. The opening OA2 separates the frame portion from the mass bodies (movable electrodes VE1, VE2). The opening OA1 is provided between the fixed portion FU and the movable electrode VE1, and between fixed portion FU and the movable electrode VE2 (refer to FIG. 5). In this patterning process, a plurality of openings (OP) penetrating through the aforementioned mass bodies MS1 and MS2 may be provided.

With the processes up to now, a bonding substrate where the MEMS layer ML is formed on the base layer BL can be formed. The bonding substrate may be indicated by "S1." Next, the cap layer CL shown in FIG. 4 is bonded and sealed on the bonding substrate, there being capable of forming the acceleration sensor according to the present embodiment.

Next, the process of forming the cap layer CL, the process of bonding the cap layer CL, and the process of sealing will be described with reference to FIGS. 7 to 22. Those figures show the process of forming the cap layer, or the process of bonding the cap layer and the sealing process in the acceleration sensor according to the present embodiment.

Figure 7:
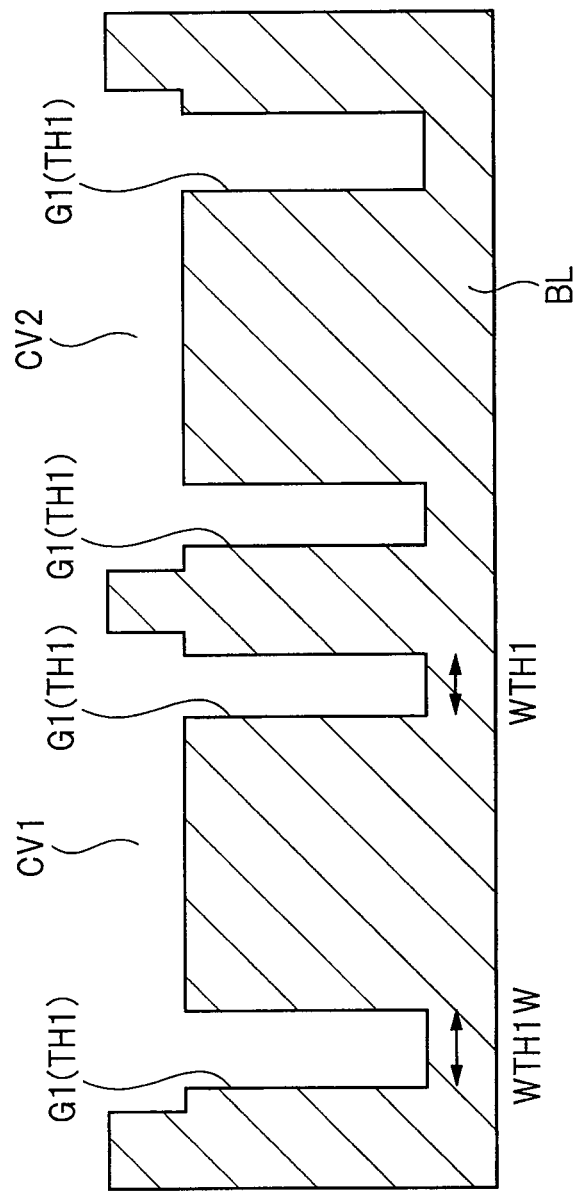
FIG. 7 is a cross-sectional view showing a process of manufacturing the acceleration sensor according to the first embodiment.
Figure 8:
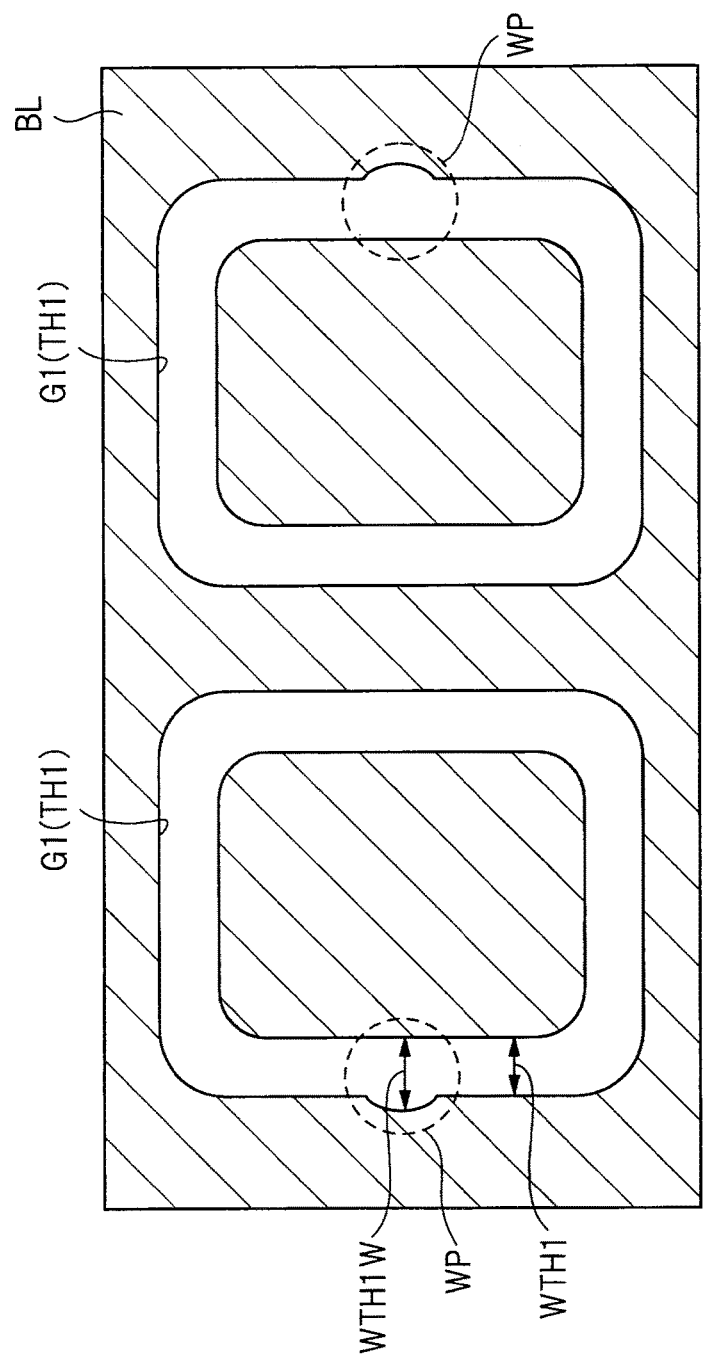
FIG. 8 is a plan view showing the process of manufacturing the acceleration sensor according to the first embodiment.

At the time of forming the cap layer CL, a silicon wafer is first prepared as a semiconductor substrate (semiconductor wafer). Next, as shown in FIGS. 7 and 8, two concave portions that serve as the cavities CV1 and CV2 are formed on the upper surface of the silicon wafer by the photolithography technique and the etching technique. The convex portion at the boundary between the two convex portions is a portion joined to the MEMS layer ML fixed portion FU. Further, the frame around the two concave portions becomes a connection portion to which the cap layer CL is bonded through the MEMS layer ML.

Subsequently, with the use of the photolithography technique and the etching technique, trenches G1 to be the through hole TH1 are formed in the bottom surfaces of the two concave portions to be the cavities CV1 and CV2. Note that after the trenches G1 have been formed, the two concave portions to be the cavities CV1 and CV2 may be formed.

The trenches (through holes TH1) G1 are provided in a substantially rectangular annular shape so as to surround the formation region of the substantially rectangular fixed electrode FE1 and the formation region of the substantially rectangular fixed electrode FE2 (refer to FIG. 8). A width of the trenches (through holes TH1) G1 is not even, and the trenches G1 partially have a wide portion WP. More specifically, a width WTH1W of the wide portion WP of the trench (through hole TH1) G1 is larger than the width WTH1 of the other portion (WTH1W>WTH1). In FIG. 9, (A) shows the trench portion of the width WTH1W and (B) shows the trench portion of the width WTH1. In this way, also in the following figures, (A) shows the trench portion with the width WTH1W, and (B) shows the trench portion with the width WTH1.

Next, as illustrated in FIG. 10, the insulating film IF1 is formed on the surface of the silicon wafer (cap layer CL) including the bottom surface and the side surface of the trench G1. For example, the surface of the silicon wafer including the bottom surface and the side surface of the trench G1 is thermally oxidized, to thereby form a silicon oxide film as the insulating film IF1. At this time, the film thickness of the insulating film (silicon oxide film) IF1 is set to such a thickness that the trench G1 having the width WTH1W is not filled. As a result, as illustrated in FIG. 10, the insulating film IF1 is formed on the bottom surface and the side surface of the trench G1 to form the through hole TH2. In other words, the trench having a width WTH2W is formed in the trench portion of the width WTH1W, and the trench having a width WTH2 is formed in the trench portion of the width WTH1. A relationship of the width WTH2W>the width WTH2 is established.

Next, as shown in FIG. 11, polysilicon P is formed on the insulating film IF1 including the inside of the trench having the width WTH2W and the inside of the trench having the width WTH2, for example, by the CVD (chemical vapor deposition) technique. At this time, the film thickness of the polysilicon P is such that the trench portion of the width WTH2 is filled but the trench portion of the width WTH2W is not filled. As a result, a gap (airway) SP not filled with polysilicon P is formed in the portion of the trench having the width WTH2W. Note that the inside of the trench having the width WTH2 may be filled with a film other than the polysilicon P. By thus providing the wide portion WP in the trench G1, a fine gap SP can be formed. In addition, the inside of the trench having the width WTH1 may be filled with a single layer film (only the insulating film IF1, for example), and the fine gap SP may be provided in the wide portion WP.

As shown in FIG. 12, the polysilicon P on the surface of the silicon wafer is etched back with the use of an etching technique. Next, as shown in FIG. 13, an insulating film (silicon oxide Film) IF1 exposed to the surface of the silicon wafer is etched back with the use of an etching technique. As a result, the polysilicon P and the insulating film IF1 on the surface of the silicon wafer are removed and the polysilicon P and the insulating film IF 1 remain only in the trench G1.

Through the above processes, the cap layer CL for bonding to the bonding substrate S1 is formed. The electrical separation of the fixed electrodes FE1 and FE2 is carried out by bonding the cap layer CL to the bonding substrate S1 and thereafter polishing the back surface of the silicon wafer.

Next, the bonding step and the sealing step of the cap layer CL will be described.

Figure 14:
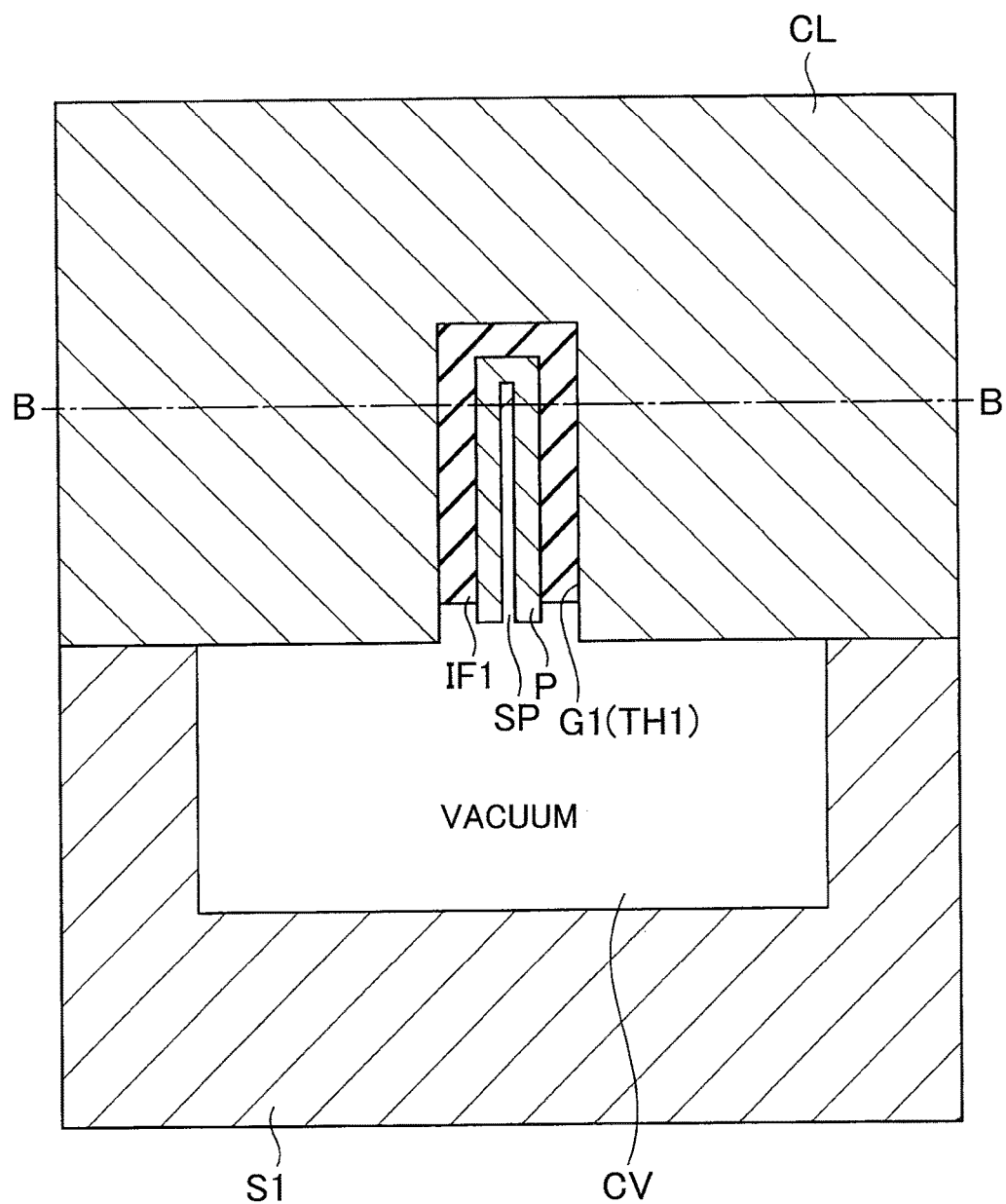
FIG. 14 is a cross-sectional view showing the process of manufacturing the acceleration sensor according to the first embodiment.

First, as shown in FIG. 14, a bonded substrate S1, which is a substrate where the MEMS layer ML is formed on the base layer BL, is prepared, and the silicon wafer serving as the cap layer CL is bonded on the bonded substrate S1 with the use of a wafer bonding technique so that the two concave portions forming the cavities CV (CV1, CV2) are located on the lower side. Specifically, the protrusion at the boundary portion between the two concave portions of the cap layer CL and the fixed portion FU of the MEMS layer ML are aligned, and the frame portion around the two concave portions and the frame portion of the MEMS layer ML are aligned (refer to FIG. 4). The alignment is performed in this way, and the bonded substrate S1 and the cap layer CL are bonded to each other. In this situation, the inside of a chamber (processing chamber) is set to a reduced pressure state (preferably a vacuum state) whereby the cavities CV (CV1, CV2) are filled with a gas having a pressure sufficiently lower than the atmospheric pressure.

Figure 15:
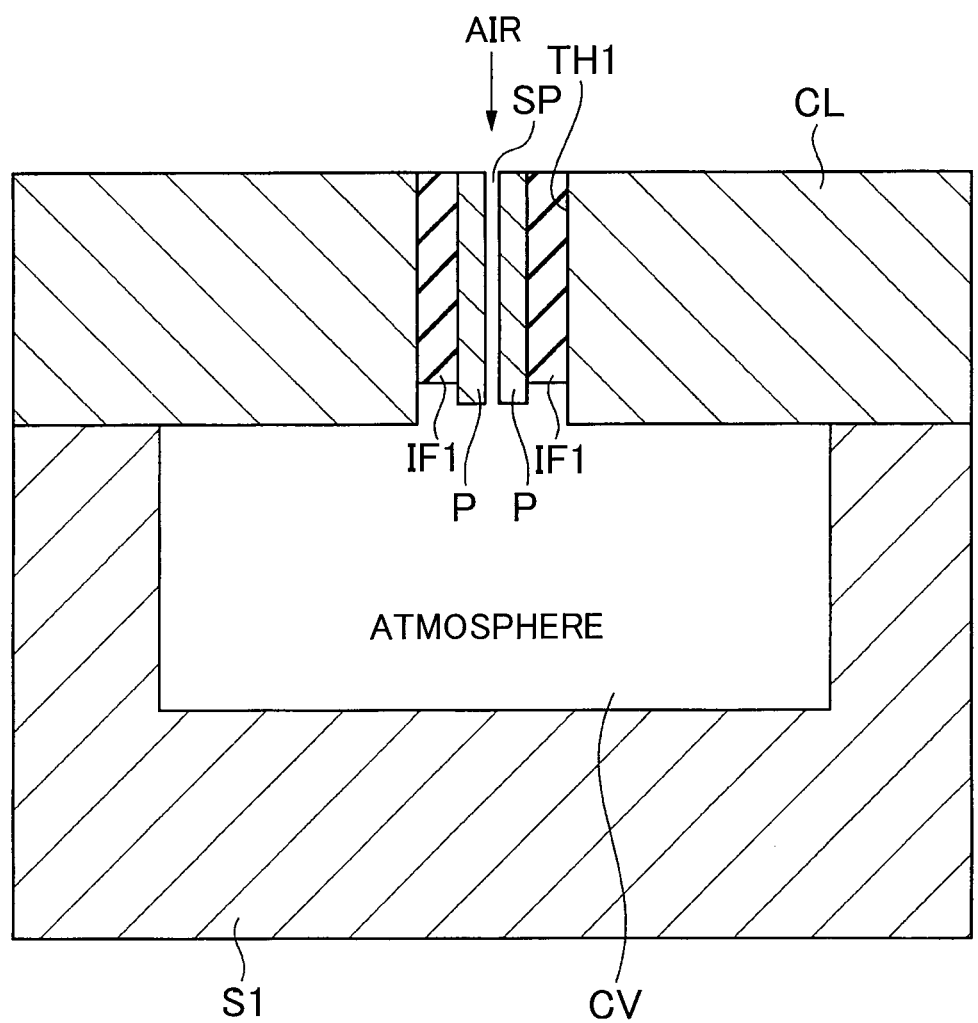
FIG. 15 is a cross-sectional view showing the process of manufacturing the acceleration sensor according to the first embodiment.

Next, as shown in FIG. 15, the back surface of the silicon wafer serving as the cap layer CL is polished until the polysilicon P in the trench G1 is exposed. For example, the back surface of the silicon wafer is polished until a portion BB shown in FIG. 14. At this time, the gap (airway) SP in the trench G1 is exposed by the polishing. Since the gap SP extends from the concave side to be the cavities CV (CV1, CV2), that is, from the front side of the silicon wafer, the gap (airway) SP becomes an air leakage path and the inside of the cavities CV (CV1, CV2) becomes atmospheric pressure. Also, the fixed electrodes FE1 and FE2 are formed by the polishing. In other words, the fixed electrodes FE1 and FE2 are electrically isolated from other regions by the insulating film IF1 embedded in the through hole TH1 (refer to FIG. 2).

Figure 16:
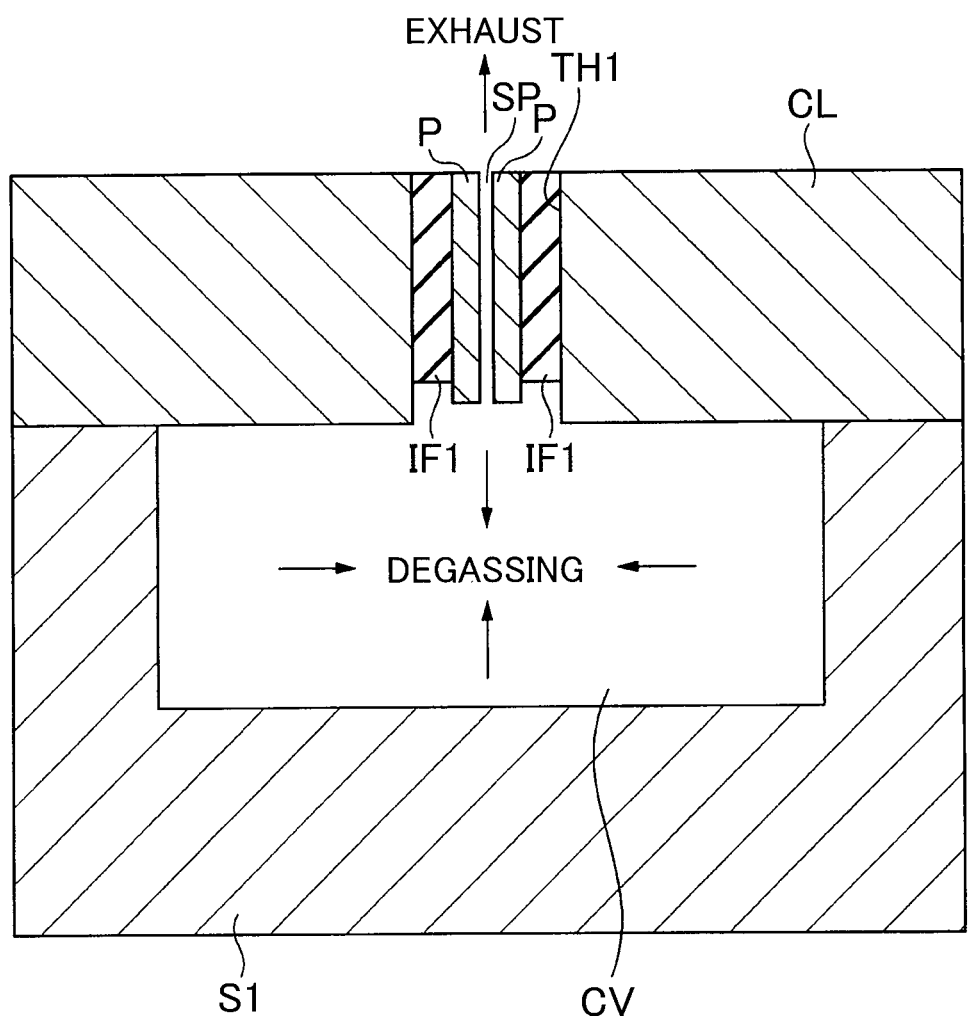
FIG. 16 is a cross-sectional view showing the process of manufacturing the acceleration sensor according to the first embodiment.

Subsequently, an interlayer insulating film IL1 is formed on the upper surface of the bonded body after reducing the pressure in the cavities CV (CV1, CV2) of the bonded body where the bonded substrate S1 and the cap layer CL are bonded to each other. For example, the bonded body in which the bonded substrate S1 and the cap layer CL are bonded to each other is transported into a chamber of a film forming apparatus such as a CVD apparatus. Next, as shown in FIG. 16, the inside of the chamber is brought into a reduced pressure state (depressurizing process). In this case, a temperature and the like may be adjusted while keeping the inside of the chamber in the reduced pressure state so as to conform to the film forming conditions (temperature, set pressure, and so on) of the interlayer insulating film IL1. Air in the cavities CV (CV1, CV2) is also exhausted through the gap (airway) SP in the reduced pressure process. Further, since the bonded body is heated up to a film forming temperature, degassing occurs from a structure around the cavities CV1 and CV2. The degassing is evacuated through the gap (airway). The evacuation is carried out until the pressure in the cavities CV (CV1, CV2) becomes equal to a pressure in the chamber.

Figure 17:
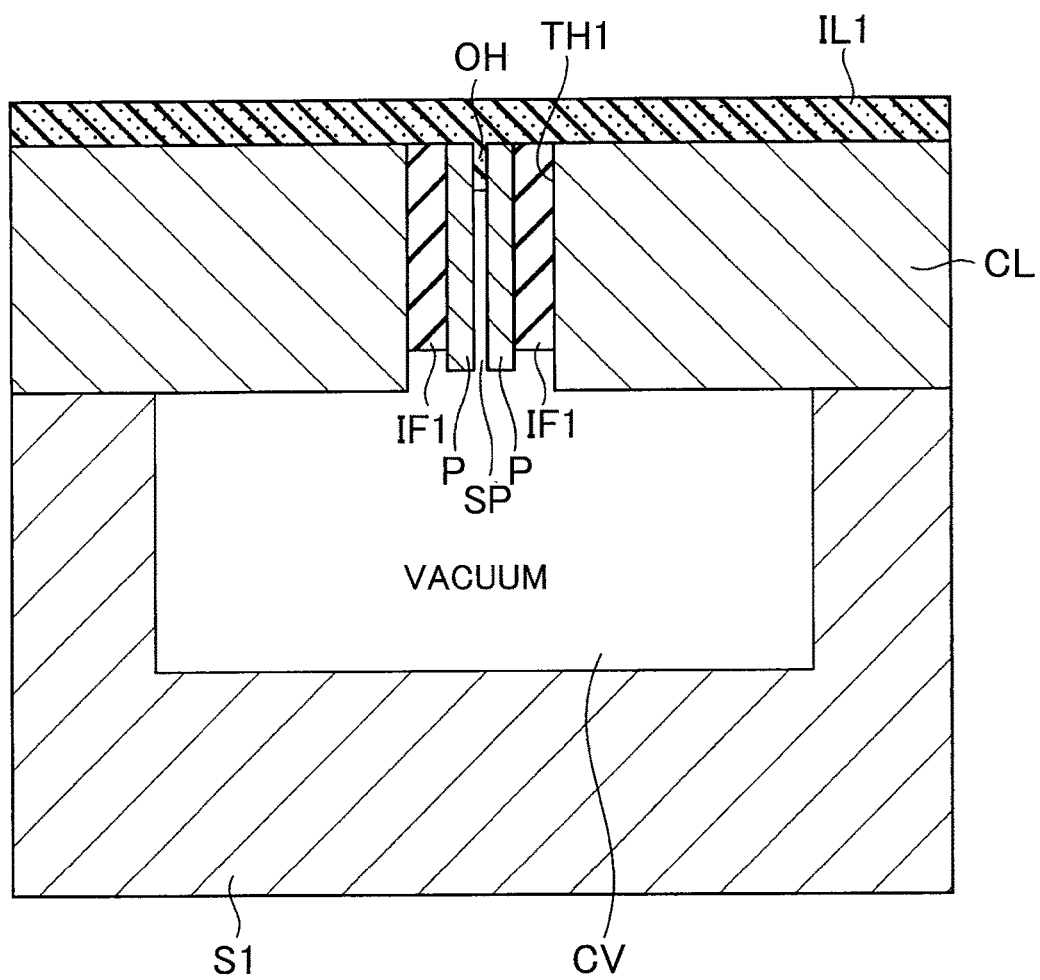
FIG. 17 is a cross-sectional view showing the process of manufacturing the acceleration sensor according to the first embodiment.

Then, as shown in FIG. 17, the interlayer insulating film IL1 is formed on the upper surface of the bonded body (the back surface of the silicon wafer serving as the cap layer CL) (film forming process). As the interlayer insulating film IL1, for example, a silicon oxide film is formed with the use of the CVD method. At the beginning of film formation, the interlayer insulating film IL1 is sequentially deposited on the upper surface of the bonded body. At this time, the interlayer insulating film IL1 are also deposited on the periphery of the gap (air passage) SP and the inside of the gap (airway) SP. For example, in the upper portion of the side wall of the gap (airway) SP, an interlayer insulating film IL1 is deposited like overhang (overhang). The upper portion of the gap (airway) SP is covered with the interlayer insulating film IL 1 due to the overhang OH. When the film thickness of the deposited film on the upper surface of the bonded body reaches a predetermined film thickness, the film formation is completed. In this situation, the inside of the cavities CV (CV1, CV2) is kept in a reduced pressure state. In this manner, the bonded body can be hermetically sealed.

After forming the interlayer insulating film IL1, the bonded body is taken out from the chamber of the film forming apparatus and cooled down to room temperature (ordinary temperature, 25° C.). At this time, according to the Boil-Charles law, the inside of the cavities CV (CV1, CV2) becomes higher vacuum. In other words, the pressure in the cavities becomes lower than the set pressure of the chamber at the time of film formation.

Figure 18:
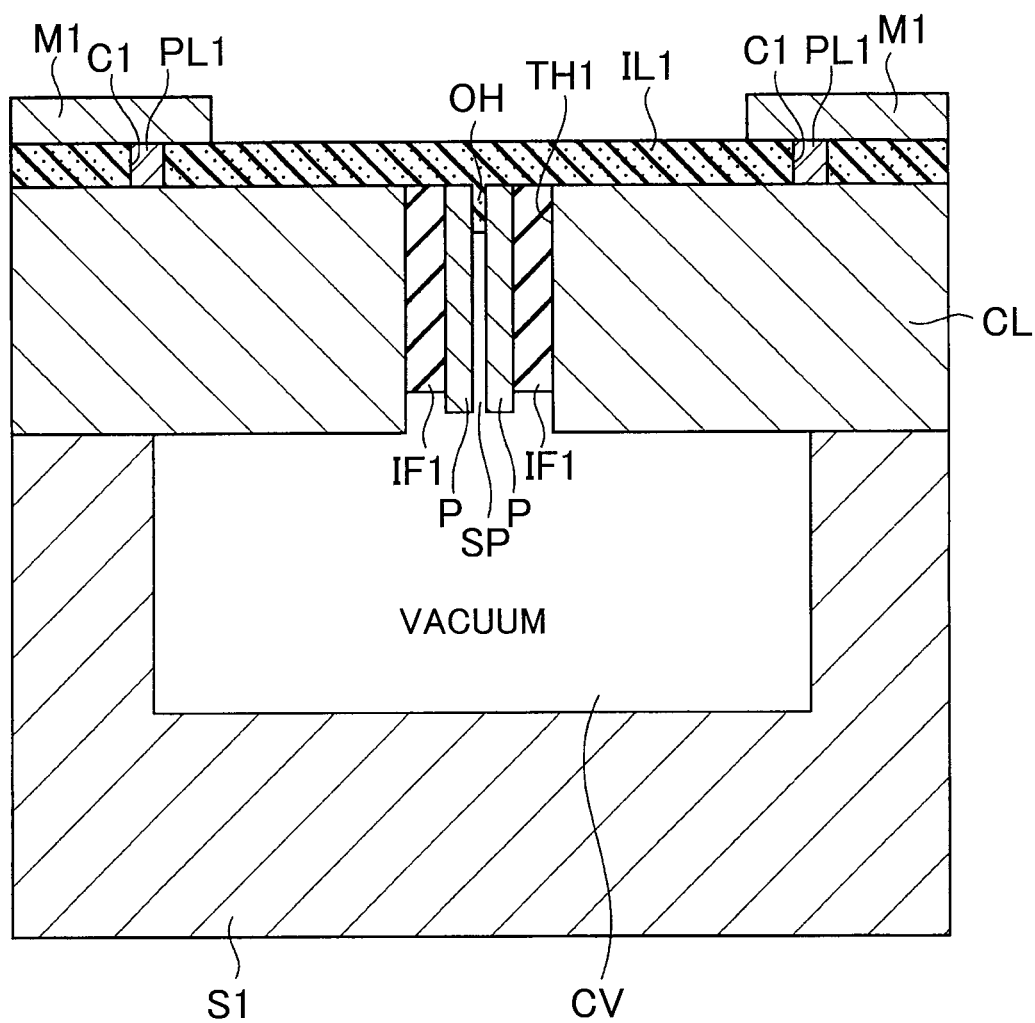
FIG. 18 is a cross-sectional view showing the process of manufacturing the acceleration sensor according to the first embodiment.

Then, as shown in FIG. 18, a connection portion (plug) PL1 is formed in the interlayer insulating film IL1, and a wiring M1 is formed on the interlayer insulating film IL1. For example, with the use of a photolithography technique and a dry etching technique, a connection hole (Contact hole) C1 is formed by partially removing the interlayer insulating film IL 1 on the fixed electrodes (FE1, FE2). Then, a conductive film is formed on the interlayer insulating film IL1 including the inside of the connection hole C1.

Subsequently, the wiring M1 is formed by patterning the conductive film through the photolithography technique and the dry etching technique. The wiring M1 serves as a wiring for supplying a signal to the fixed electrodes FE1 and FE2, for example. Thereafter, a wiring of an uppermost layer may be further formed. For example, the wiring is also connected between the fixed electrodes (FE1, FE2) and the movable electrodes VE1, VE2. In addition, a protective film may be formed on the wiring of the uppermost layer. Through the above processes, the acceleration sensor according to the present embodiment can be formed.

As described above, according to the present embodiment, in the process of forming a conductive film for wiring, even when a thermal load is applied, the degassing is reduced from the structure around the cavities CV (CV1, CV2) even if a small amount of air in the cavities CV (CV1, CV2) expands due to the heat load after hermetically sealing, the reduced pressure state in the cavities CV (CV1, CV2) is kept at about the set pressure of the chamber at the time of film formation according to the Boil-Charles law, and the reduced pressure state in the cavities CV (CV1, CV2) can be maintained. Hence, a leakage due to degassing and the thermal expansion is reduced, and the reduced pressure state in the cavities CV (CV1, CV2) can be maintained.

Hereinafter, the sealing process will be described in more detail with reference to FIGS. 19 to 22.

Figure 19:
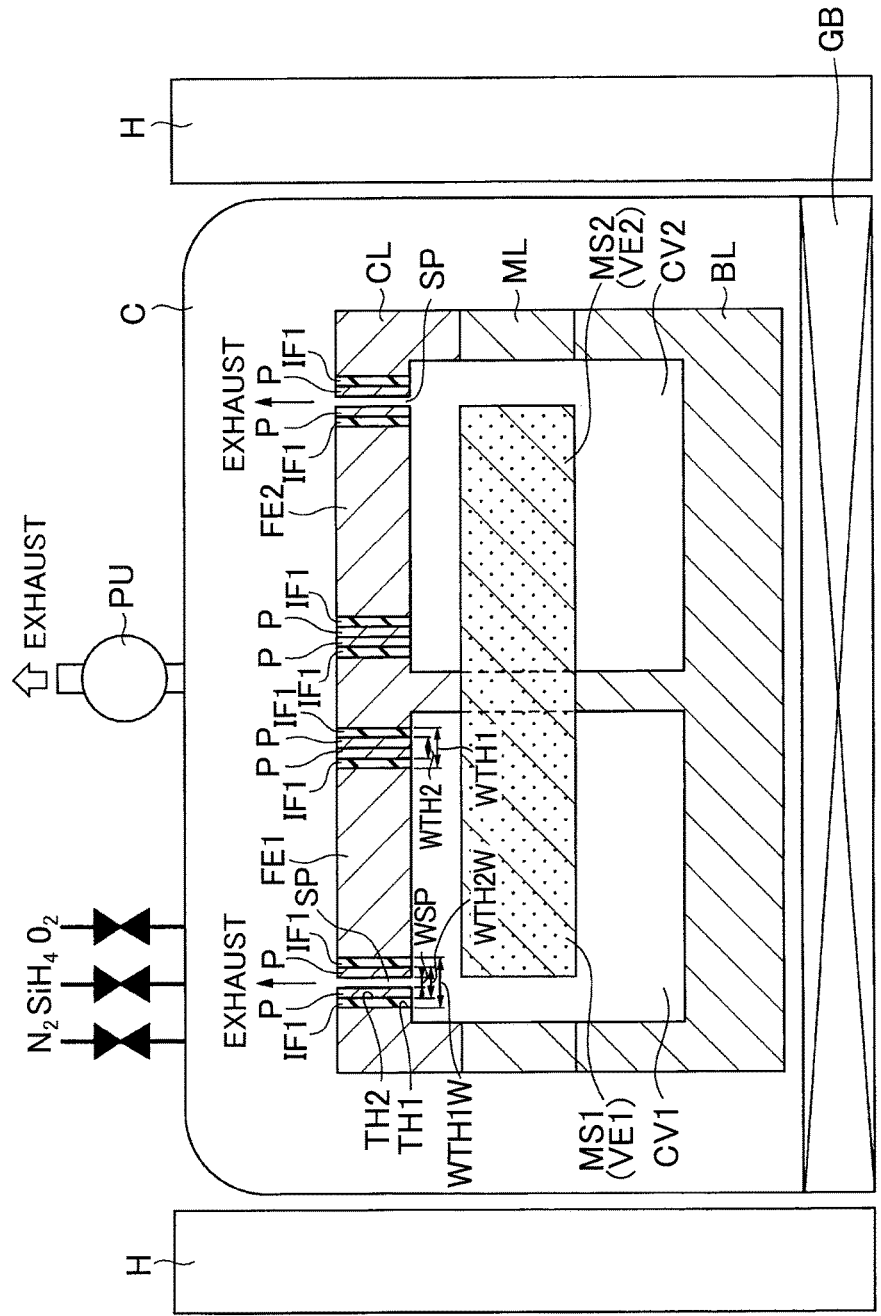
FIG. 19 is a cross-sectional view showing the process of manufacturing the acceleration sensor according to the first embodiment.

First, as shown in FIG. 19, the bonded body in which the cap layer CL, the MEMS layer ML, and the base layer BL are bonded to each other is brought onto a stage (not shown) in the chamber of the film forming apparatus. In this example, a pressure reducing CVD (LP-CVD: low pressure CVD)) apparatus will be described as an example of the film forming apparatus, but other film forming apparatuses may be applied, for example, a PVD (Physical Vapor Deposition) apparatus may be used. For example, a pressure reducing CVD apparatus shown in FIG. 19 has a chamber (processing chamber) C. A resistance heater H is disposed around the chamber C. A gate valve GB is provided on one side (in this example, the lower side) of the chamber C. An object to be processed is loaded and unloaded into/from the chamber C by opening and closing the gate valve GB. A vacuum pump PU for evacuation is connected to the chamber C. A gas introduction portion is connected to the chamber C through a valve (valve). In this case, three gas introduction portions for $N_2$, $SiH_4$ and $O_2$ are connected to the chamber C.

After bringing the bonded body into the chamber, evacuation is carried out until the inside of the cavity CV has the same pressure as the pressure in the chamber. For example, the pressure in the chamber is set to 5 Pa, and the inside of the cavity CV is evacuated to 5 Pa. At this time, the inside of the chamber is maintained at 500° C., and the inside of the cavity is also heated to about 500° C. (pressure reducing process).

Figure 20:
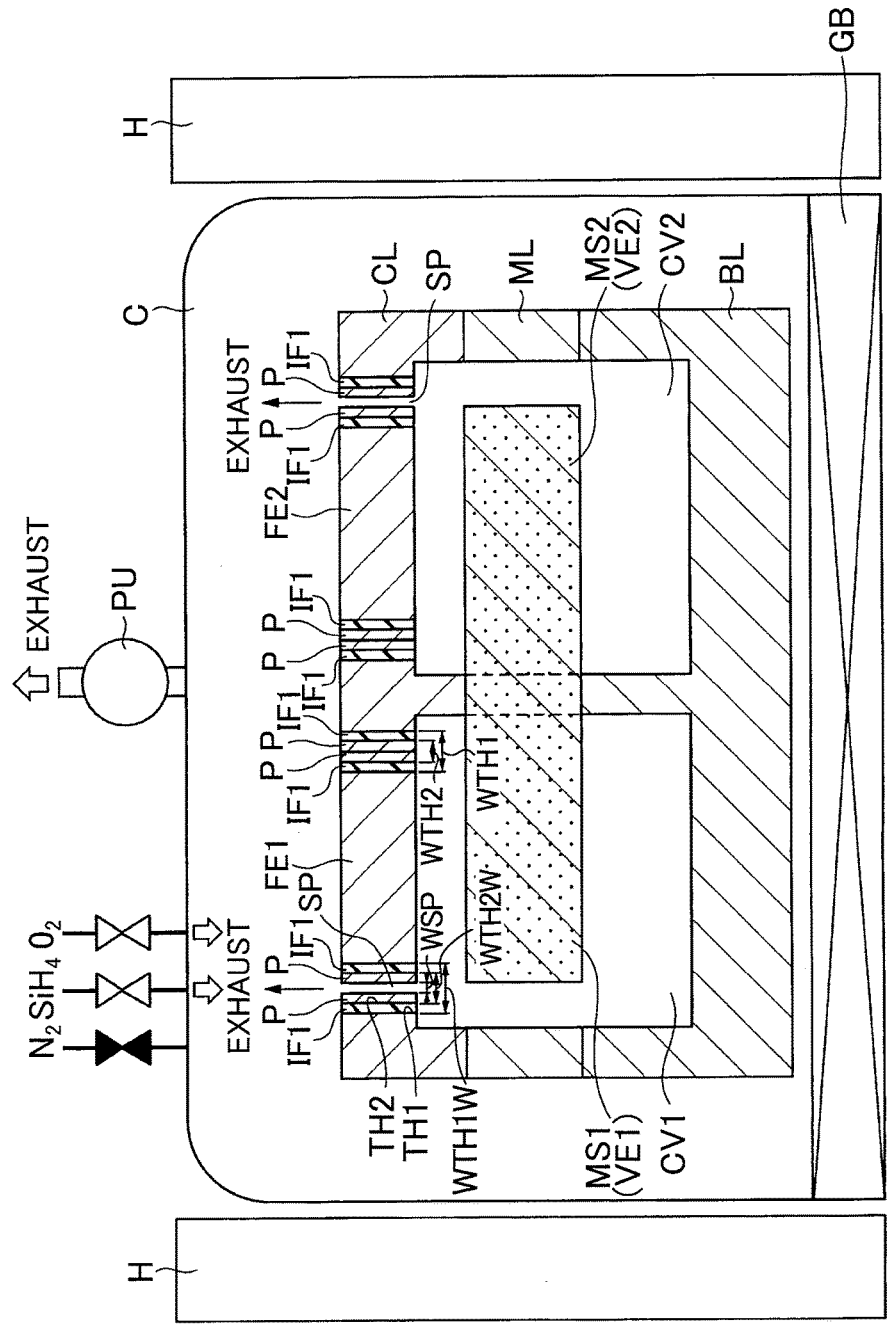
FIG. 20 is a cross-sectional view showing the process of manufacturing the acceleration sensor according to the first embodiment.

Then, as shown in FIG. 20, a film forming gas is introduced into the chamber C. For example, the valves of the two gas introduction portions for $SiH_4$ and $O_2$ are opened, $SiH_4$ and $O_2$ are introduced into the chamber C, and a silicon oxide film is formed as the interlayer insulating film IL1. In the case where another film is used as the interlayer insulating film IL1, a raw material gas is introduced into the chamber C. At the time of gas introduction, a control is performed so that the pressure in the chamber becomes 50 Pa, and the temperature in the chamber becomes 500° C. For that reason, the inside of the cavities CV also becomes 50 Pa and 500° C.

Figure 21:
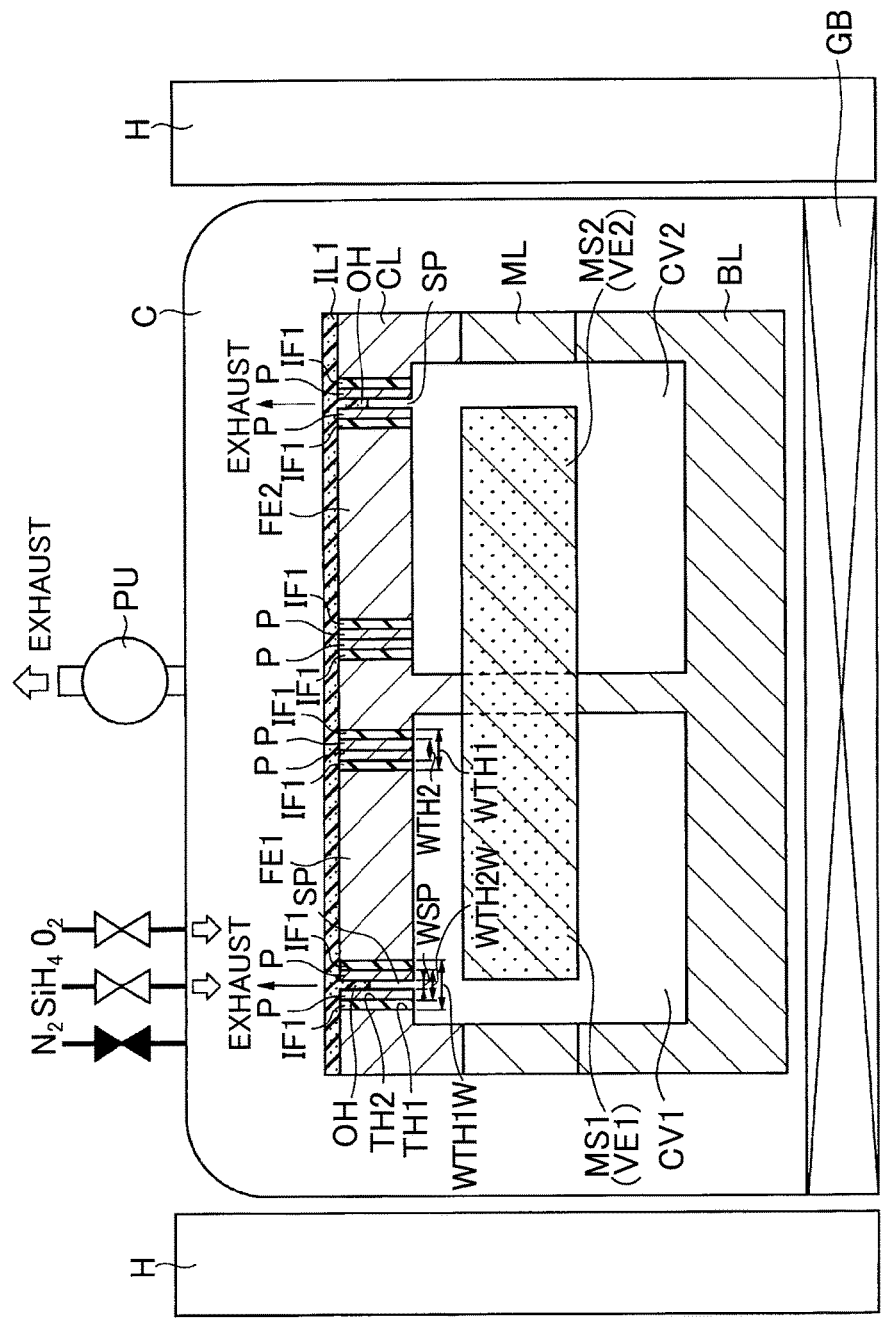
FIG. 21 is a cross-sectional view showing the process of manufacturing the acceleration sensor according to the first embodiment.

The raw material gas (SiH$_4$ and O$_2$) of the silicon oxide film are introduced, and as shown in FIG. 21, a silicon oxide film (interlayer insulating film IL 1) starts to be formed on the upper surface of the bonded body (a surface opposite to the concave portion of the cap layer CL). At this time, a silicon oxide film is deposited (overhanging) in the form of an overhang at the upper portion of the side wall of the gap (air passage) SP. Due to this overhang OH, the upper portion of the gap (air passage) SP is covered with the silicon oxide film. At this time, similarly to the inside of the chamber, the inside of the cavity CV is 50 Pa and 500° C. As the deposition of the silicon oxide film proceeds in this way, the upper portion of the gap (air passage) SP is covered with the silicon oxide film. Further, the film thickness of the silicon oxide film on the upper surface of the bonded body is increased.

Figure 22:
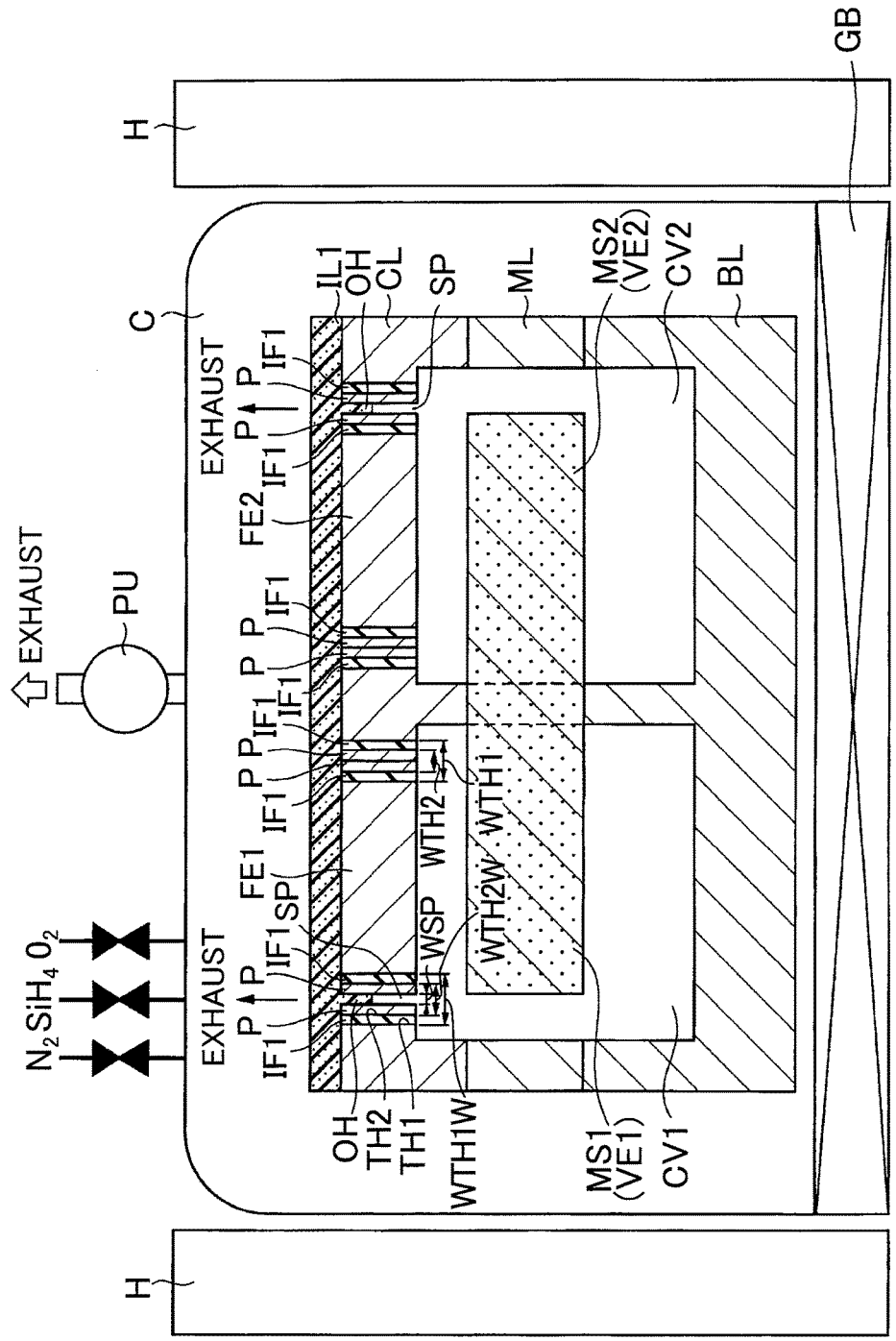
FIG. 22 is a cross-sectional view showing the process of manufacturing the acceleration sensor according to the first embodiment.

Next, as shown in FIG. 22, after the silicon oxide film (interlayer insulating film IL1) has a predetermined film thickness, the valve of the gas introduction portion is closed and the raw material gases (SiH$_4$ and O$_2$) remaining in the chamber C are evacuated. After evacuation of the gas in the chamber C, the pressure in the chamber is, for example, 5 Pa, and the temperature in the chamber C is 500° C. However, the inside of the cavities C is kept in a state of being hermetically sealed at 50 Pa and 500° C.

Then, the bonded body (refer to FIG. 3) having the interlayer insulating film IL1 formed on the upper surface thereof is unloaded from the low pressure CVD apparatus. At this time, because the outside of the apparatus is at the atmospheric pressure (1013 hPa=101300 Pa) and at room temperature (25° C.), the inside of the cavities CV is cooled from 500° C. to 25° C. As a result of cooling, the pressure in the cavity CV decreases, for example, to about 20 Pa due to the Boil-Charles law.

Thereafter, as described above, the acceleration sensor can be formed by forming the connection portion PL1, the wiring M1, the protective film, and the like.

In the above process, the film formation conditions are set to 50 Pa and 500° C. However, other conditions may be employed. For example, as the film formation conditions, the film formation pressure Pr1 and the film formation temperature Te1 are assumed, and the pressure (sealing pressure, pressure inside product) and the temperature (sealing temperature, operating temperature) after completion of the acceleration sensor Let Pr2 and Te2 are set as Pr2 and the film formation temperature Te2, respectively. When a ratio of the pressure and the temperature (pressure/temperature) are Pr1/Te1 and Pr2/Te2, Pr1/Te1 may be set in a range of Pr2/Te2 Pr1/Te1 (provided that Pr2=Pr1 and Te2=Te1 is not excluded) so as to satisfy the desired Pr2/Te2. In the above process, for example, Pr1=50 Pa, Te1=500° C., Pr2=20 Pa, Te2=25° C. are met.

Since the acceleration sensor formed in the above process can maintain the reduced pressure state in the cavities CV as described above, the acceleration sensor can be operated with high sensitivity and small dispersion.

Figure 23:
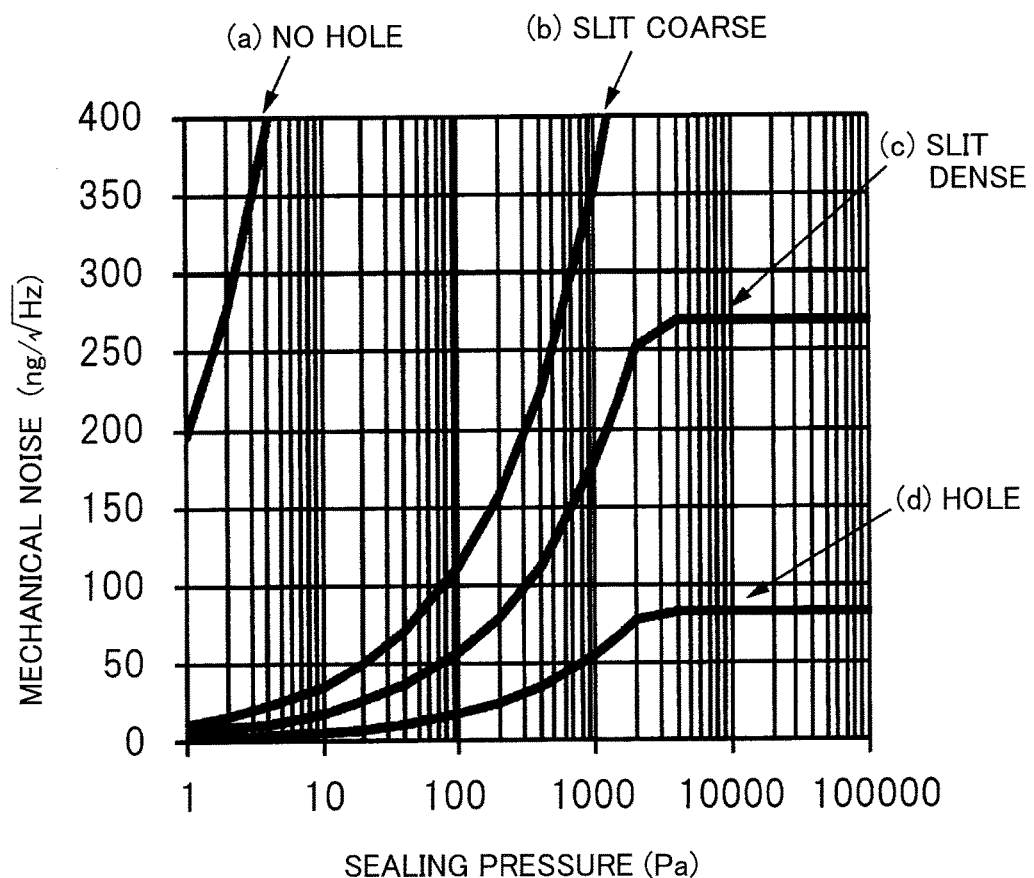
FIG. 23 is a graph showing a relationship between a sealing pressure and a mechanical noise in the acceleration sensor.

FIG. 23 is a graph showing a relationship between the sealing pressure and the mechanical noise of the acceleration sensor. The horizontal axis represents the sealing pressure (Pa), and the vertical axis represents the mechanical noise (ng/√Hz). A graph (a) shows a case where the opening is not provided in the mass body ((a) without a hole), a graph (b) shows a case where the mass body is provided with a coarse slit-like opening ((b) slit coarse), a graph (c) shows a case where the slit-shaped opening portion densely attached to the mass body is provided ((c) slit dense), and a graph (d) shows a configuration in which a hole-shaped opening is provided ((d) hole).

As described above, in any of the configurations, it can be seen that the mechanical noise decreases as the sealing pressure decreases. Hence, the reduced pressure state in the cavity CV can be maintained in the present embodiment. In addition, the sealing pressure can be easily reduced by adjusting the film forming conditions (pressure, temperature), and the mechanical noise can be reduced. As a result, the S/N ratio can be improved, thereby being capable of realizing an acceleration sensor with high sensitivity and small variation.

Figure 24:
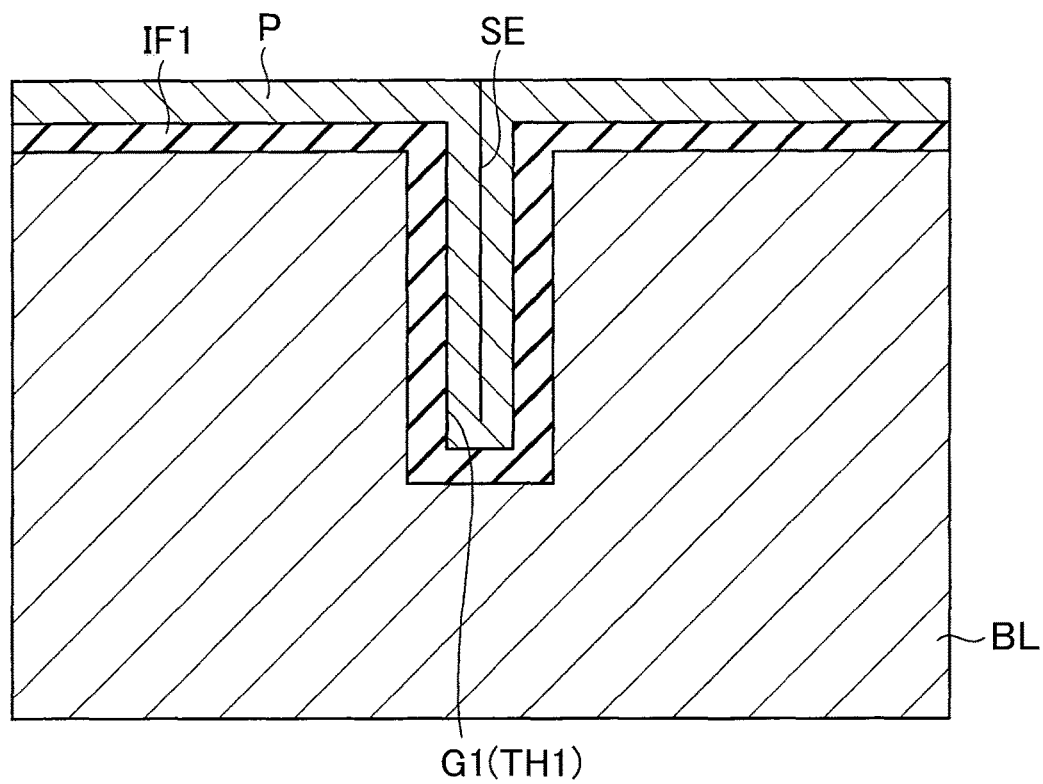
FIG. 24 is a cross-sectional view showing a process of manufacturing an acceleration sensor according to one comparative example.

FIGS. 24 to 29 are sectional views showing the manufacturing process of the acceleration sensor in the comparative example. For example, the wide portion WP is not provided in the trench G1 (through hole TH1), and as shown in FIG. 24, the trench G1 can be filled with the insulating film IF1 and the polysilicon P. In such a case, a seam SE is likely to be formed in the vicinity of the center of the embedded film. When such a seam SE is formed, the seam SE becomes a leak path at the time of sealing and the airtightness is lowered, resulting in a decrease in the sensitivity of the acceleration sensor.

In order to cut the continuity of such a seam SE inside the trench G1 (through hole TH1), the following trench filling process can also be considered.

For example, the insulating film IF1 and the polysilicon P are sequentially formed on the surface of the silicon wafer serving as the base layer BL and inside the trench G1. With this process, the trench G1 is filled with the insulating film IF1 and the polysilicon P (FIG. 24). According to such an embedding method, a seam SE can occur.

Figure 25:
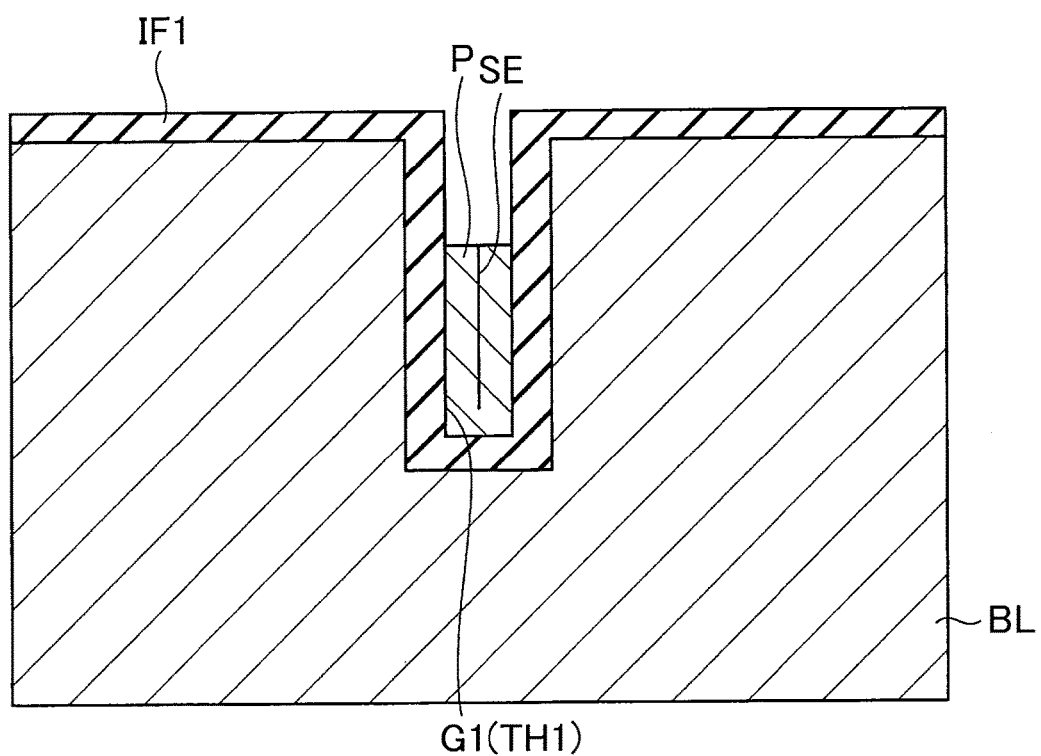
FIG. 25 is a cross-sectional view showing a process of manufacturing an acceleration sensor according to another comparative example.
Figure 26:
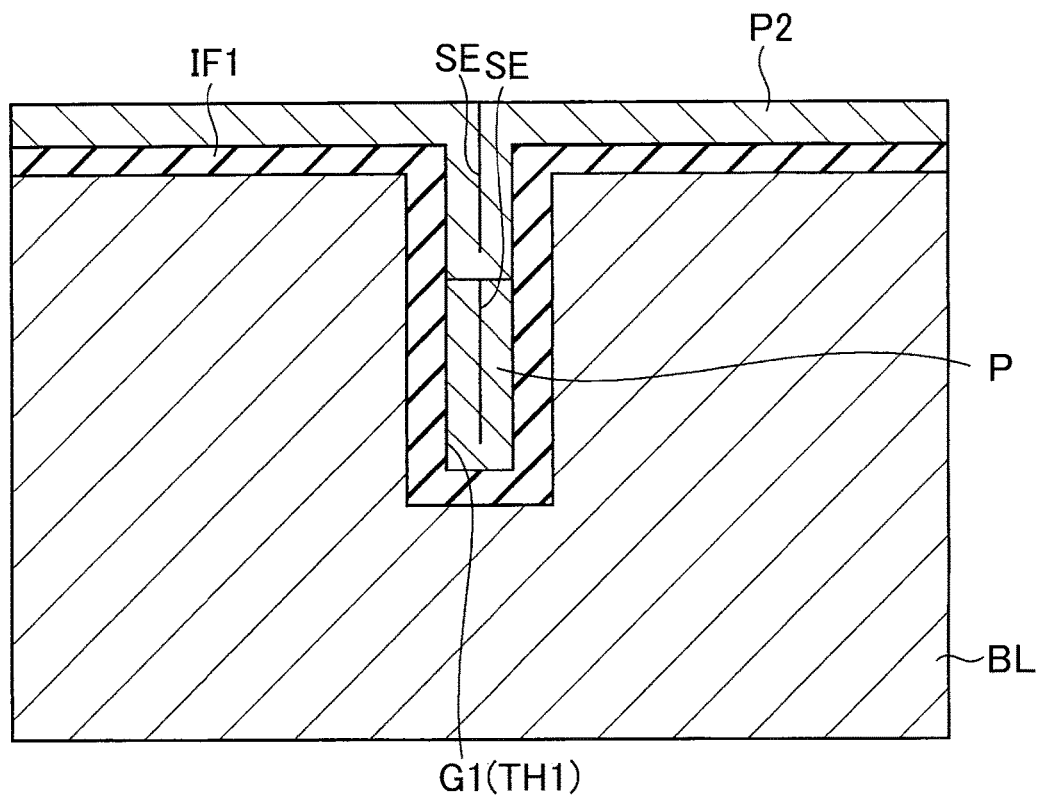
FIG. 26 is a cross-sectional view showing a process of manufacturing an acceleration sensor according to another comparative example.
Figure 27:
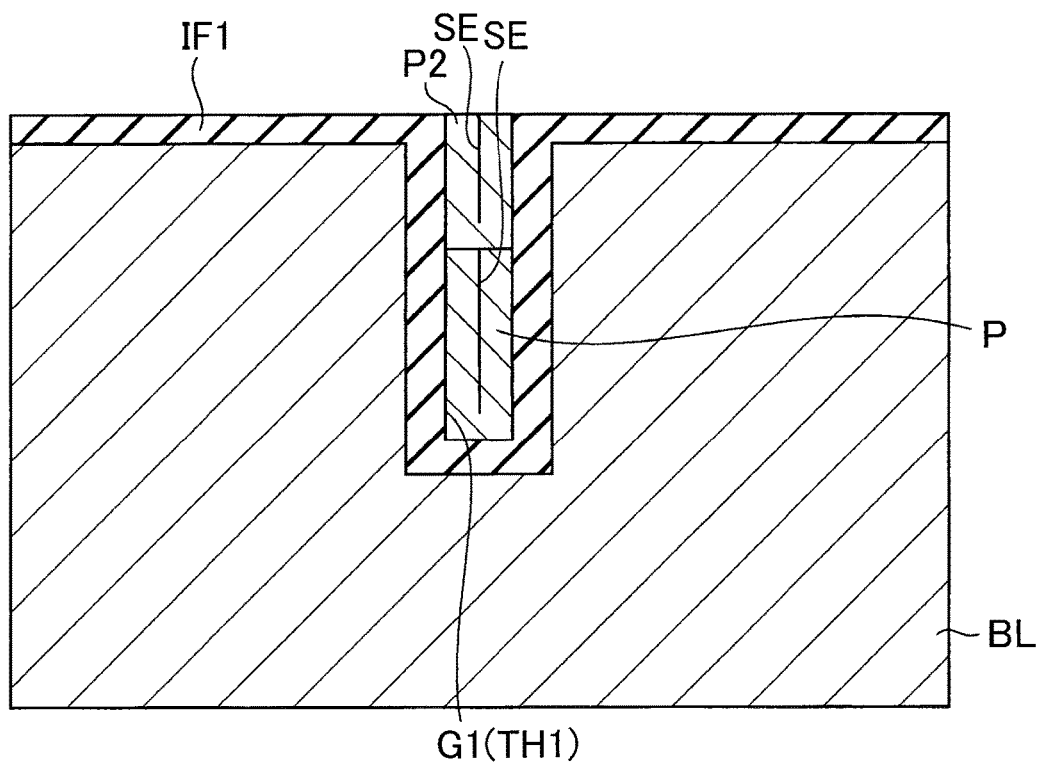
FIG. 27 is a cross-sectional view showing a process of manufacturing an acceleration sensor according to another comparative example.

Next, the polysilicon P is etched back to the middle of the trench G1. As a result, a space is created above the trench G1 (FIG. 25). Then, polysilicon P2 is formed on the polysilicon P on the insulating film IF1 and in the trench G1 (FIG. 26). At this time, the polysilicon P2 is formed so as to cover the seam SE on the polysilicon P in the trench G1. Therefore, even if a seam SE is newly formed at the time of forming the polysilicon P2, the continuity between the seam SE of the polysilicon P portion and the seam SE of the polysilicon P2 portion disappears. Next, the polysilicon P2 is removed by etch-back until the insulating film IF1 is exposed (FIG. 27).

Figure 28:
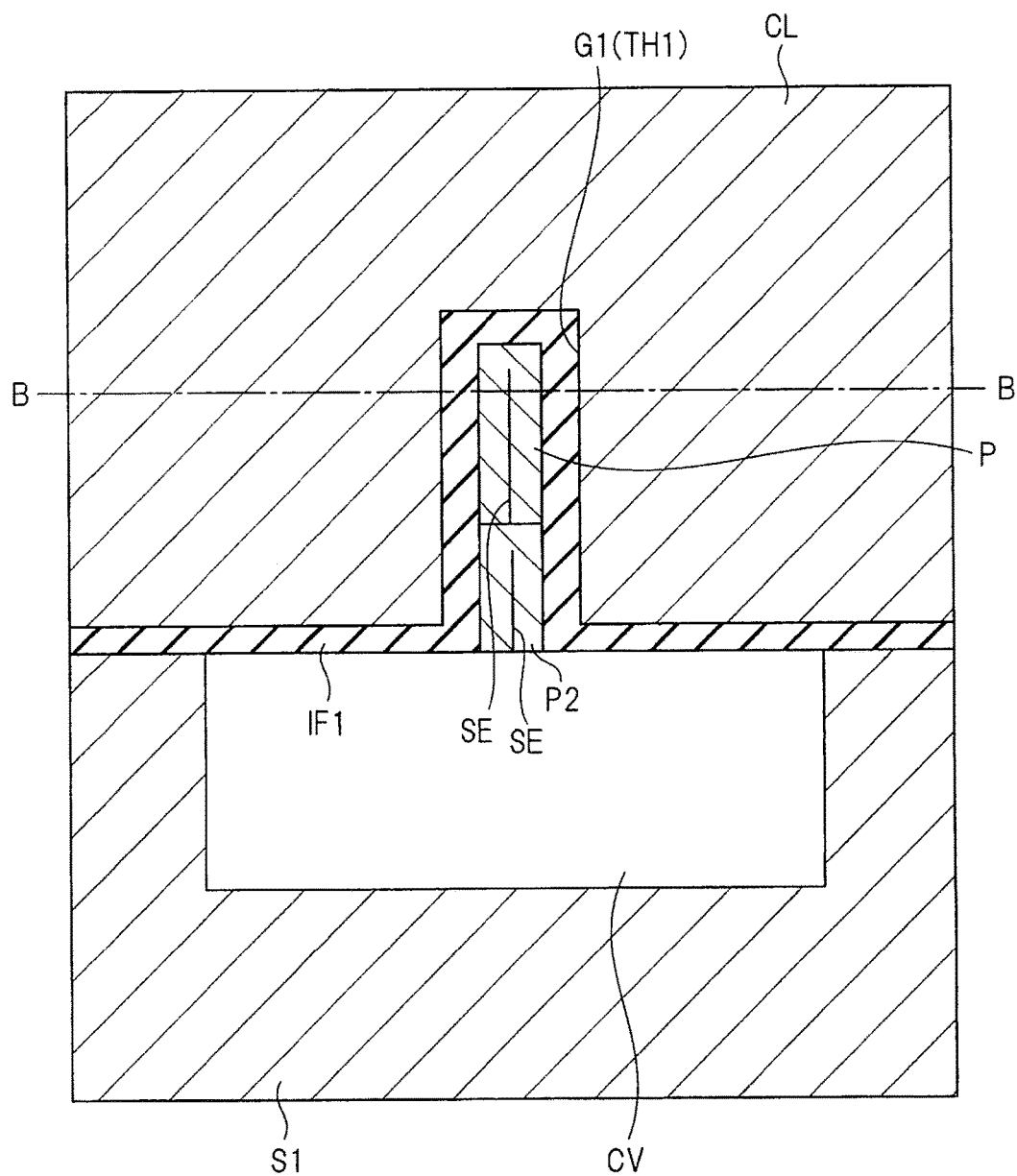
FIG. 28 is a cross-sectional view showing a process of manufacturing an acceleration sensor according to another comparative example.
Figure 29:
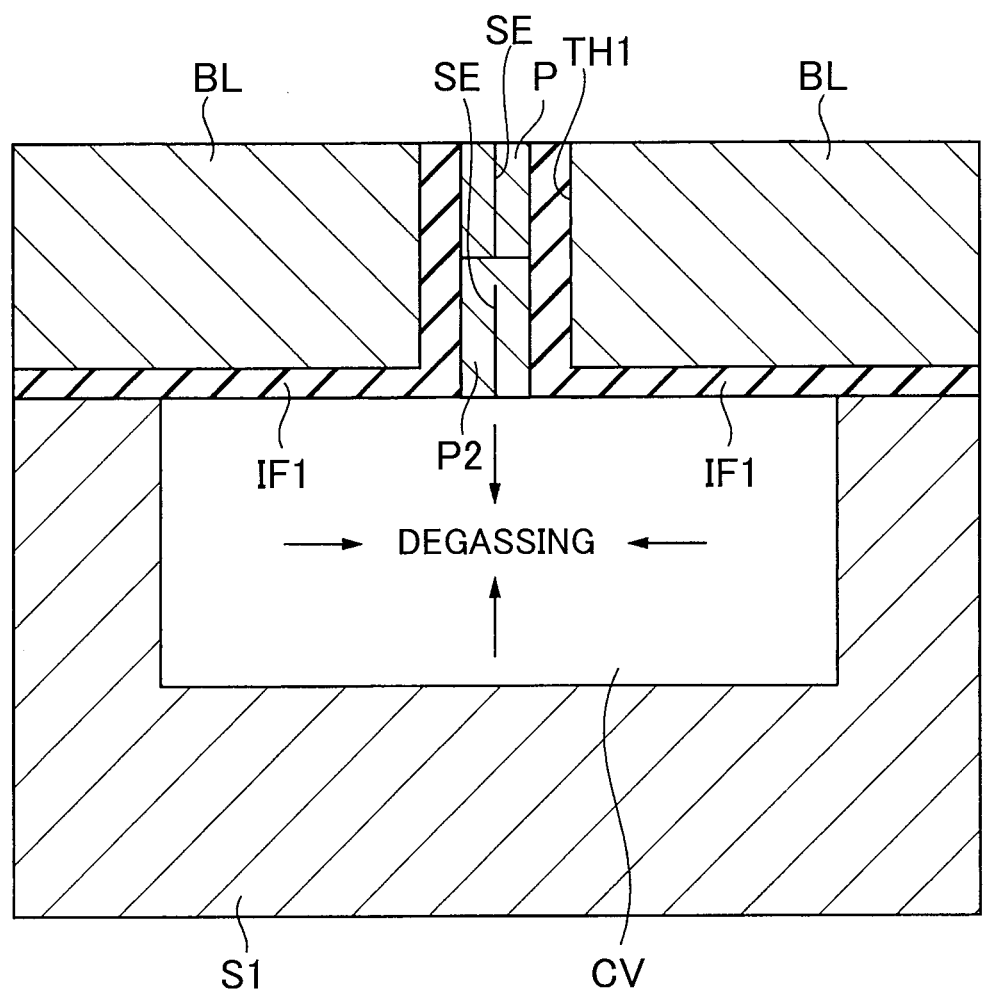
FIG. 29 is a cross-sectional view showing a process of manufacturing an acceleration sensor according to another comparative example.

Next, the cap layer CL is bonded to the bonded substrate S1 which is the substrate on which the MEMS layer is formed on the base layer by using the wafer bonding technique (FIG. 28). The bonding is carried out under a reduced pressure atmosphere. At this time, as described above, since the seam SE is not continuous, the seam SE does not become a leak path and a reduced pressure state of the cavity CV is secured to a certain extent. Then, the back surface of the silicon wafer, which is the cap layer CL, is polished up to the B-B portion so that the polysilicon P in the trench G1 is exposed (FIG. 29).

However, in the filled structure (TSV structure) of the trench G1 in this comparative example, the pressure of the cavity CV can be increased by degassing to be described later. In other words, due to the heat load at the time of bonding and the heat load after bonding (for example, processing temperature at the time of film formation of the conductive film configuring the wiring M1), degassing occurs from the structure surrounding the cavity CV (FIG. 29). Due to this degasification, the pressure in the cavity CV increases, and airtightness also decreases.

In contrast to this, in the present embodiment, degassing can be evacuated through the gap (airway) SP in the reduced pressure state (reduced pressure process). The gap (airway) SP is covered by the formation of the interlayer insulating film formed in the upper portion of the gap SP. Further, the pressure in the cavity after the gap (airway) SP has been covered can be easily adjusted with the use of the reduced pressure condition and the temperature condition at the time of forming the interlayer insulating film. In this way, airtightness in the cavity can be enhanced and the degree of airtightness thereof can be adjusted by a simple process without obtaining a complicated process. As a result, the sensitivity of the acceleration sensor can be increased. In addition, variations in the sensitivity of the acceleration sensor can be reduced.

Second Embodiment

Figure 30:
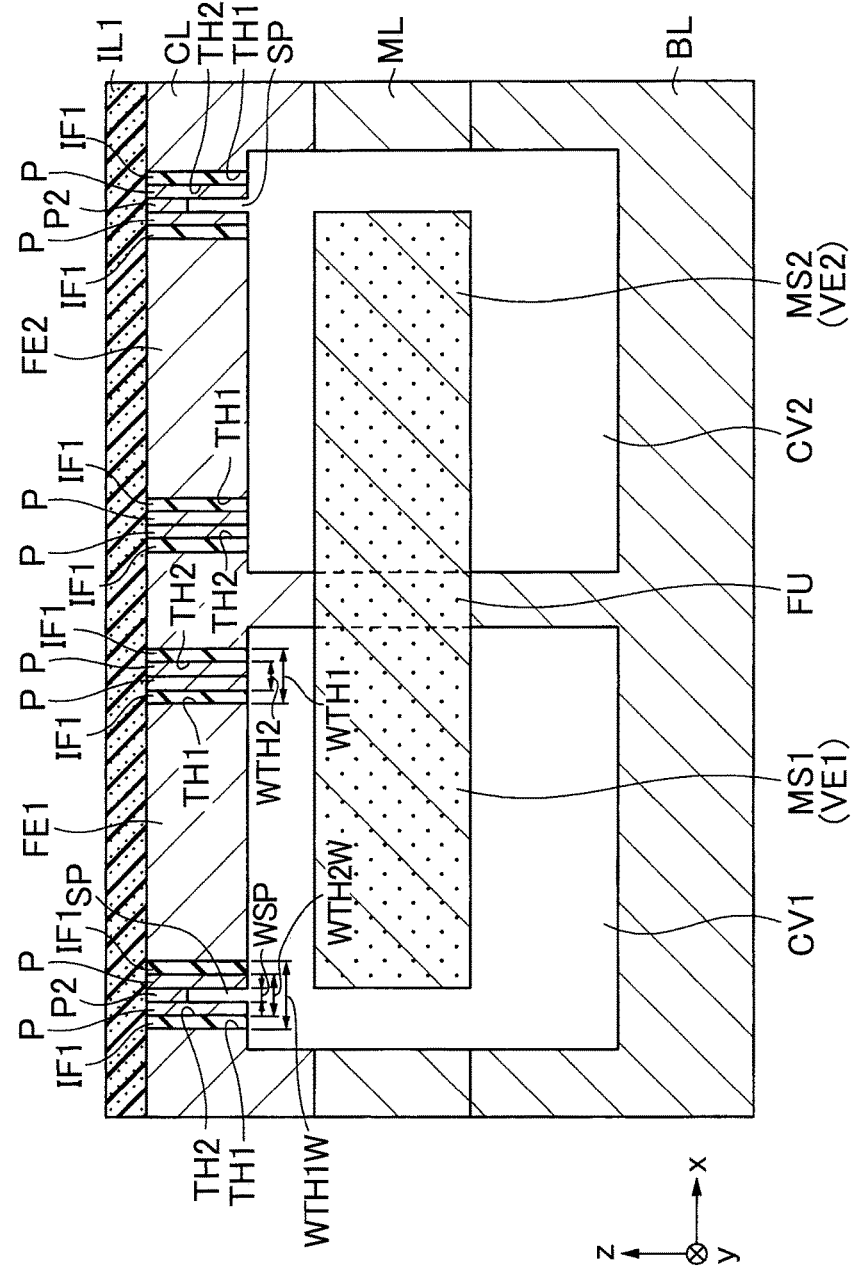
FIG. 30 is a cross-sectional view showing a configuration of an acceleration sensor according to a first application of a second embodiment.

In the present embodiment, applications of the configuration of the acceleration sensor according to the first embodiment shown in FIG. 3 and the like will be described.
(Application 1)
In the first embodiment (FIG. 3), the upper portion of the gap (airway) SP is covered with the interlayer insulating film IL1, but the upper portion of the gap (airway) SP may be covered with a different film from the interlayer insulating film IL1.
[Structure Description]
FIG. 30 is a cross-sectional view showing the configuration of the acceleration sensor according to an application 1 of the present embodiment. Meanwhile, the configuration other than the film that buries the upper portion of the gap (airway) SP is almost the same as in the case of the first embodiment, and therefore its detailed description will be omitted.

As shown in FIG. 30, the polysilicon P2 is arranged in the gap (airway) SP in the polysilicon P of the wide portion (WP). Therefore, in the cross section of the wide portion (WP) of the through hole TH1, the insulating film IF1, the polysilicon P, the polysilicon P2, the polysilicon P, and the insulating film IF1 are arranged in the stated order.

The interlayer insulating film IL1 is disposed on the fixed electrodes FE1 and FE2 surrounded by the through hole TH1.
[Description of Manufacturing Method]
Next, a process of cover the gap (airway) SP with a film (for example, polysilicon P2) different from the interlayer insulating film IL1 will be described.

First, as described with reference to FIG. 16 of the first embodiment, the bonded body obtained by bonding the bonded substrate S1 and the cap layer CL to each other is transported into the chamber C of a film forming apparatus such as a low pressure CVD apparatus, and the inside in the chamber C is put into a reduced pressure state (pressure reducing process). At this time, while keeping the inside of the chamber C in the reduced pressure state, the temperature and the like may be adjusted so as to match the film forming conditions (temperature, set pressure, and so on) of the polysilicon P2. The air in the cavity CV is also evacuated through the gap (airway) SP in the pressure reducing process. Because the joined body is heated up to a film forming temperature, degassing occurs from the structure around the cavities CV (CV1, CV2). Degassing is evacuated through the gap (airway) SP. The evacuation is performed until the pressure in the cavity CV becomes equal to the pressure inside the chamber. For example, vacuum evacuation is performed so that the pressure in the chamber is 5 Pa and the pressure in the cavity CV is also 5 Pa.

Subsequently, polysilicon P2 is formed on the upper surface of the bonded body (the back surface of the silicon wafer to be the cap layer CL) (film forming process). When the film formation is started, polysilicon P2 is sequentially deposited on the upper surface of the bonded body. At this time, the inside of the cavity CV is kept in a reduced pressure state and the inside of the cavity CV is 50 Pa and 500° C. like the inside of the chamber. As the deposition of the polysilicon P2 progresses, polysilicon P2 is also deposited around the gap (airway) SP and inside the gap (airway) SP. For example, polysilicon P2 deposits overhanging like an overhang at the upper portion of the side wall of the gap (airway) SP. As a result of the overhang, the upper portion of the gap (airway) SP is covered with the polysilicon P2. Also, the polysilicon P2 is deposited on the upper surface of the bonded body.

Next, the valve of the gas introduction portion is closed, and the material gas for the polysilicon P2 remaining in the chamber C is evacuated. After the gas in the chamber C has been evacuated, the pressure inside the chamber is, for example, 5 Pa, and the temperature becomes 500° C. However, the inside of the cavity CV remains hermetically sealed at 50 Pa and 500° C.

Subsequently, the bonded body obtained by bonding the bonded substrate S1 and the cap layer CL from each other is carried out from the low pressure CVD apparatus. Since the outside of the apparatus is at atmospheric pressure and at room temperature (about 25° C.), the inside of the cavity CV Is cooled from 500° C. to 25° C. As a result of cooling, the pressure in the cavity CV decreases, for example, to about 20 Pa due to the Boil-Charles law.

Next, the polysilicon P 2 formed on the upper surface of the bonded body is removed by etching back until the fixed electrodes FE1 and FE2 are exposed.

Subsequently, a silicon oxide film, for example, is formed as an interlayer insulating film IL1 on the upper surface of the bonded body by the CVD method or the like. Thereafter, in the same manner as in the first embodiment, the connection portion PL1, the wiring M1, the protective film, and the like are formed, thereby being capable of forming an acceleration sensor.

As described above, also in this application, as described in the first embodiment, airtightness in the cavity can be enhanced and the degree of airtightness thereof can be adjusted by a simple process without obtaining a complicated process. As a result, the sensitivity of the acceleration sensor can be increased. In addition, variations in the sensitivity of the acceleration sensor can be reduced.

Also in this application, as described in the first embodiment, the film formation conditions are not limited to 50 Pa and 500° C. Other conditions may be used. For example, as the film formation conditions, it is assumed that the film formation pressure is Pr1, the film formation temperature is Te1, the pressure after completion of the acceleration sensor (sealing pressure, pressure in the product), and the temperature (sealing temperature, operating temperature) are Pr2 and the film forming temperature is Te2. When a ratio of the pressure and the temperature (pressure/temperature) are Pr1/Te1 and Pr2/Te2, Pr1/Te1 may be set in a range of Pr2/Te2≥Pr1/Te1 (except for Pr2=Pr1 and Te2=Te1) so as to satisfy the desired Pr2/Te2.
(Application 2)
In FIG. 5 of the first embodiment, the description of a plurality of openings penetrating through the mass bodies MS1 and MS2 is omitted, but as shown in FIG. 31, for example, a plurality of openings OP1 and OP2 penetrating through the mass bodies MS1 and MS2 may be provided.

Figure 31:
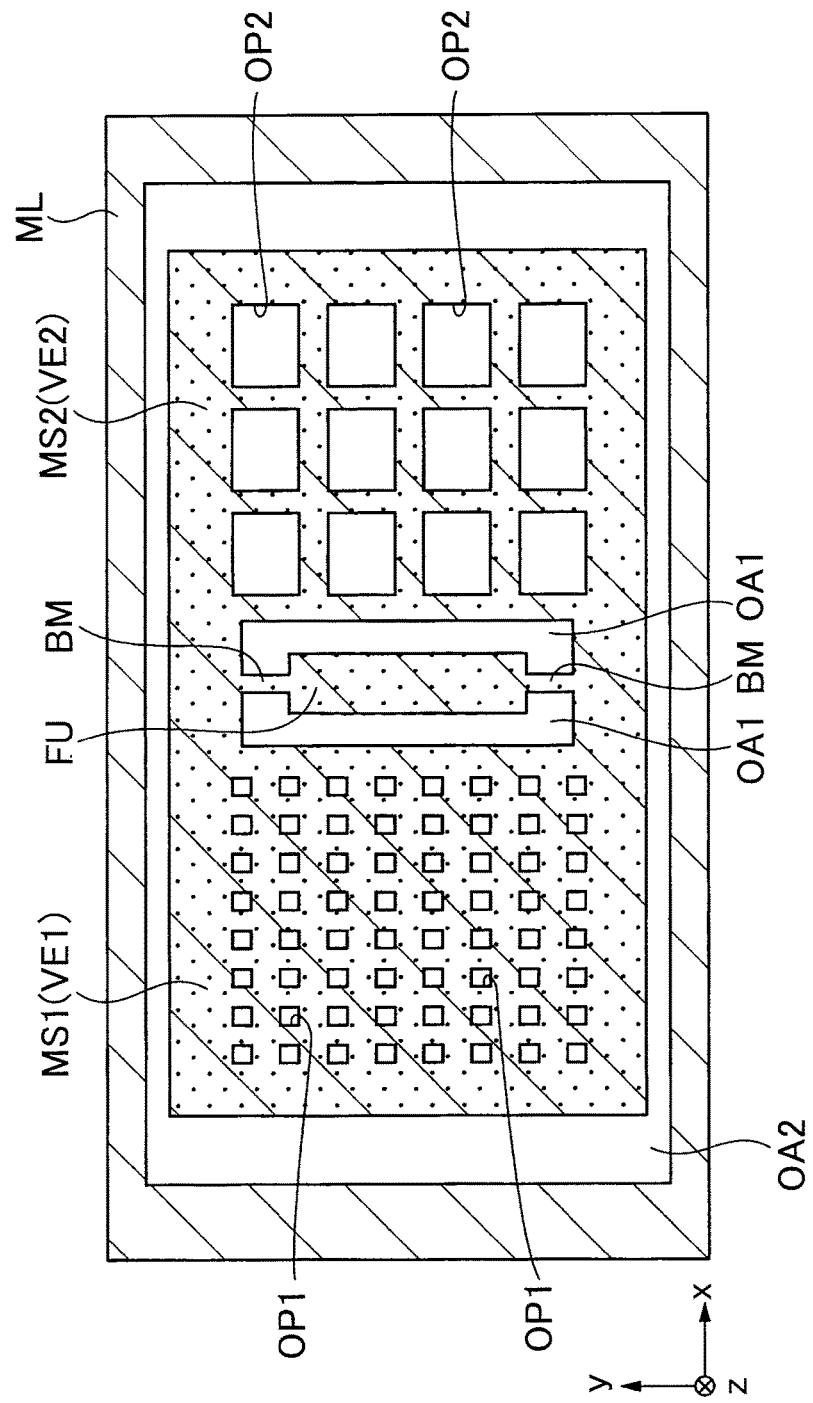
FIG. 31 is a plan view showing a configuration of an MEMS layer in an acceleration sensor according to a second application of the second embodiment.

FIG. 31 is a plan view showing the configuration of the MEMS layer of the acceleration sensor according to Example 2 of the present embodiment. FIG. 31 is a plan view of the MEMS layer ML viewed from above.

As shown in FIG. 31, the MEMS layer ML of this application example has mass bodies MS1 and MS2. The fixed portion FU between those mass bodies is a portion gripped between the convex portion of the base layer BL and the concave portion of the gap layer CL. The mass body MS1 is disposed in the cavity (CV1), and the mass body MS2 is disposed in the cavity (CV2).

In this example, a plurality of openings OP1 are formed in the mass body MS1, and a plurality of openings OP2 are formed in the mass body MS 2. The plane shapes (shapes viewed from top) of the openings OP1 and OP2 are formed in a rectangular shape (substantially square shape, hole shape), and the size of the opening OP1 is smaller than the size of the opening OP2. In the mass body MS1, eight openings OP1 are arranged vertically and eight openings OP1 are arranged horizontally at predetermined intervals. In the mass body MS2, four openings OP2 are arranged vertically and three openings OP2 are arranged horizontally at predetermined intervals.

In the first embodiment and the second embodiment, a so-called "seesaw structure" having movable electrodes VE1, VE2 on both sides of the fixed portion FU is employed.

According to such a configuration, the capacitance change of the first variable capacitance (the capacitance between the movable electrode VE1 and the fixed electrode FE1) and the capacitance change of the second variable capacitance (the movable electrode VE2 and the fixed electrode FE2) when the acceleration in the z direction is applied are opposite in characteristic to each other. In other words, when the capacitance of the first variable capacitance increases, the capacitance of the second variable capacitance decreases. On the other hand, when the capacitance of the first variable capacitance decreases, the capacitance of the second variable capacitance increases. As a result, the acceleration sensor with the seesaw structure can obtain the following advantages.

For example, let us consider a configuration in which a first variable capacitance and a second variable capacitance are connected in series between a first input terminal and a second input terminal, and a CV conversion portion is connected to a connection portion (connection node) between the first variable capacitance and the second variable capacitance. First, modulated signals with opposite phases different in phase by 180° are applied to the first input terminal and the second input terminal. In this case, the capacitance of the first variable capacitance when the acceleration is not applied is defined as "C1" and the electrostatic capacity of the second variable capacitance when acceleration is not applied is set to "C2". When the acceleration is applied, it is assumed that the capacitance of the first variable capacitance increases to "C1+ΔC1" while the capacitance of the second variable capacitance decreases to "C2−ΔC2". In this case, since modulation signals (V) having opposite phases are applied to the first input terminal and the second input terminal, charges of Q1=(C1+ΔC1)V are accumulated in the first variable capacitance. On the other hand, charges of Q2=−(C2−ΔC2)V are accumulated in the second variable capacitance. Therefore, the amount of charge transfer in the first variable capacitor and the second variable capacitor as a whole is (C1+ΔC1)V−(C2−ΔC2)V=(C1−C2)V+(ΔC1+ΔC2)V. In other word, when modulation signals having opposite phases are applied to the first input terminal and the second input terminal, a difference between the capacitance "C1" of the first variable capacitance and the capacitance "C2" of the second variable capacitance is obtained, and a ratio of the component of the capacitance change (ΔC1+ΔC2) caused by the acceleration is increased to the charge transfer amount. Therefore, the influence of the capacitance "C1" and the capacitance "C2" irrelevant to the capacitance change (ΔC1+ΔC2) caused by the acceleration is reduced (C1−C2) in the charge transfer amount. As a result, the component of the capacitance change (ΔC1+ΔC2) caused by the acceleration included in the signal can be increased. As a result, the detection sensitivity of the acceleration can be improved.

Also, there may be a difference between the mass of the mass body MS1 and the mass of the mass body MS2. For example, the size and the number of the opening OP1 and the opening OP2 are adjusted, thereby causing a mass difference between the mass body MS1 and the mass body MS2. As a result, for example, when acceleration is applied in the +z direction, a heavier mass body (for example, MS1) displaces in the −z direction. On the other hand, a lighter mass body (for example, MS2) is displaced in the +z direction to perform the seesaw operation, and the detection sensitivity of the acceleration can be improved.

(Application 3)

In this application, an example of the type of the film embedded in the gap SP and the film forming condition will be described.

For example, the silicon oxide film can be formed by the low pressure CVD using $Si(OC_2H_5)_4$ as a raw material gas. The deposition pressure is 20 to 200 Pa, and the film formation temperature is 650 to 750° C.

For example, the silicon oxide film can be formed by the plasma CVD using $SiH_4$ and $N_2O$ as raw material gases. The deposition pressure is 30 to 500 Pa, and the film formation temperature is 250 to 400° C.

For example, the silicon oxide film can be formed by the plasma CVD using $Si(OC_2H_5)_4$ and $O_2$ as raw material gases. The deposition pressure is 30 to 700 Pa, and the film formation temperature is 350 to 450° C.

For example, the silicon nitride film can be formed by the low pressure CVD using $SiH_2Cl_2$ and $NH_3$ as raw material gas. The deposition pressure is 20 to 200 Pa, and the film formation temperature is 650 to 800° C.

For example, the silicon nitride film can be formed by the plasma CVD using $SiH_4$ and $NH_3$ as raw material gases. The deposition pressure is 30 to 500 Pa, and the film formation temperature is 250 to 400° C.

For example, the PSG film can be formed by the atmospheric pressure CVD using $SiH_4$, $PH_3$, and $O_2$ as raw material gases. The deposition pressure is the atmospheric pressure (atmospheric pressure), and the film formation temperature is 350 to 450° C.

For example, the BPSG film can be formed by the atmospheric pressure CVD using $SiH_4$, $PH_3$, $B_2H_6$, and $O_2$ as raw material gases. The deposition pressure is the atmospheric pressure (atmospheric pressure), and the film formation temperature is 350 to 450° C.

For example, the polysilicon film can be formed by low pressure CVD using $SiH_4$ as a raw material gas. The deposition pressure is 20 to 200 Pa, and the film formation temperature is 550 to 650° C.

For example, the phosphorus-doped polysilicon film can be formed by the low pressure CVD using $SiH_4$ and $PH_3$ as raw material gases. The deposition pressure is 20 to 200 Pa, and the film formation temperature is 550 to 650° C.

In addition, a TEOS film or an Al alloy film may be used as the film filling the gap SP. The TEOS film can be formed by plasma CVD and the Al alloy film can be formed by PVD.

Third Embodiment

In the first and second embodiments, the case of the acceleration sensor with the so-called "seesaw structure" has been described, but in the present embodiment, the case of the acceleration sensor with a so-called "cantilever structure" will be described.

[Description of Structure]

Figure 32:
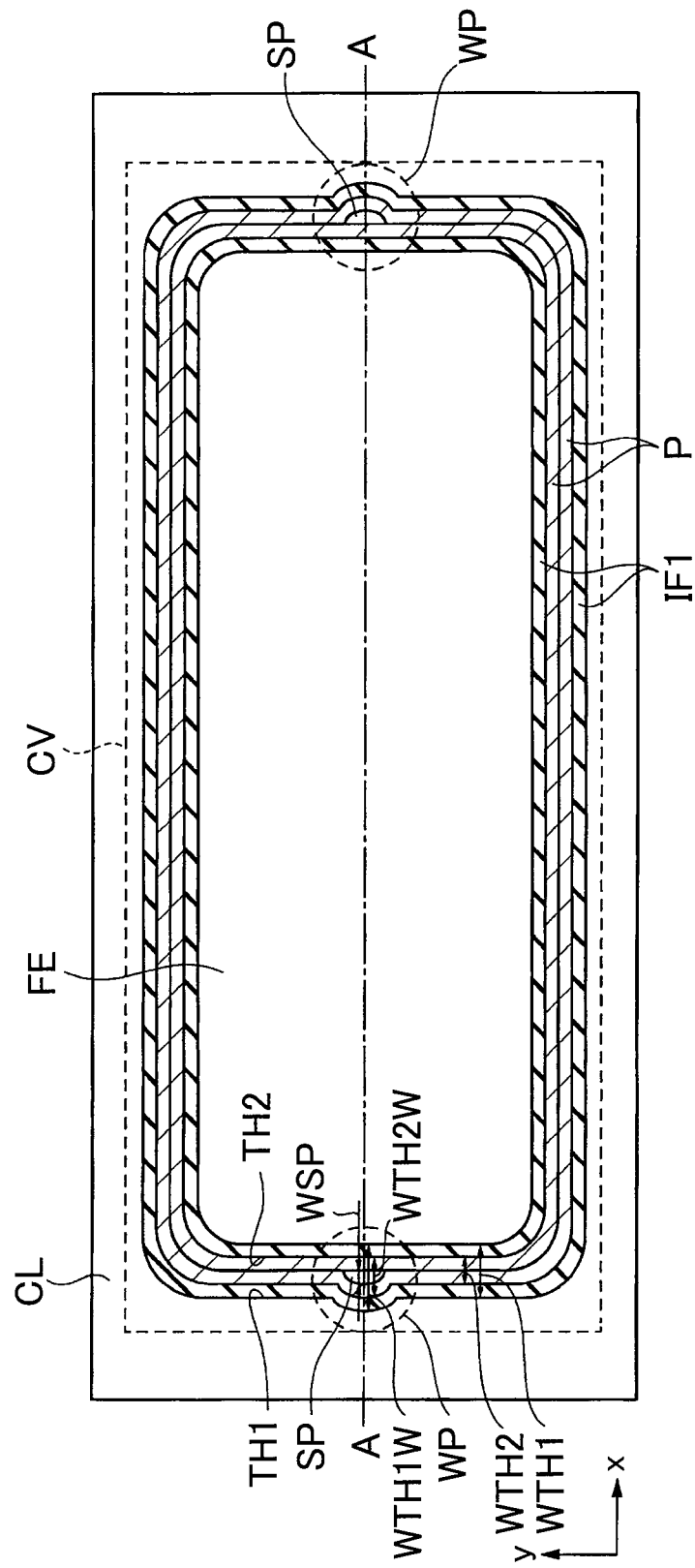
FIG. 32 is a plan view showing a configuration of an acceleration sensor according to a third embodiment.
Figure 33:
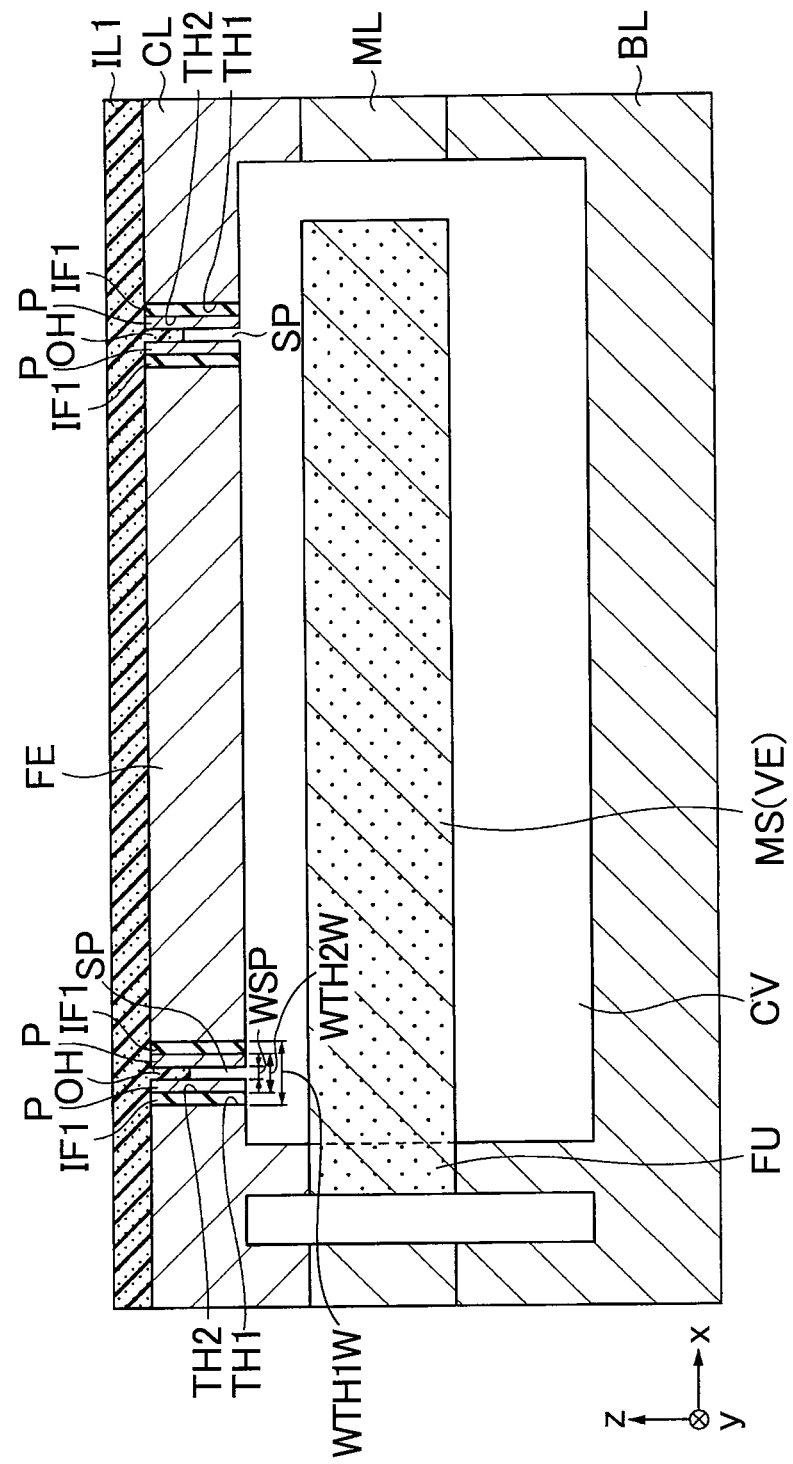
FIG. 33 is a cross-sectional view showing the configuration of the acceleration sensor according to the third embodiment.
Figure 34:
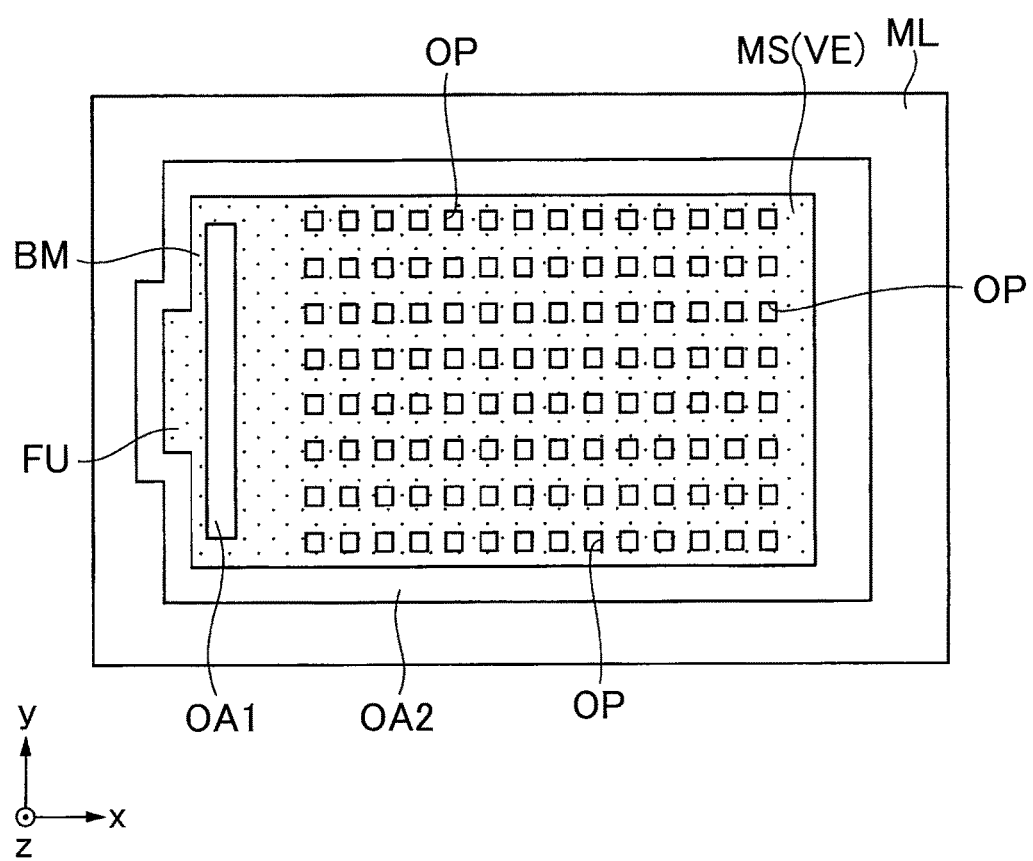
FIG. 34 is a plan view showing a configuration of an MEMS layer in the acceleration sensor according to the third embodiment.

FIGS. 32 and 33 are a plan view and a sectional view showing the configuration of the acceleration sensor according to the present embodiment. For example, an A-A section in FIG. 32 corresponds to FIG. 33. FIG. 34 is a plan view showing a configuration of an MEMS layer of the acceleration sensor according to the present embodiment. FIG. 34 is a plan view of the MEMS layer viewed from above.

As shown in FIG. 33, the acceleration sensor according to the present embodiment has three layers (cap layer CL, MEMS layer ML, base layer BL). The cap layer CL and the base layer BL have concave portions, and the acceleration sensor according to the present embodiment is configured to sandwich a mass body MS provided in the MEMS layer ML between the cap layer CL and the base layer BL.

As shown in FIG. 33, the base layer BL has a concave portion to be a cavity CV. The convex portion at an end (the left end in FIG. 33) of the concave portion is a portion joined to the fixed portion FU of the MEMS layer ML. Further, an outer periphery of the concave portion serves as a frame portion (frame) to be joined to the MEMS layer ML. The base layer BL is made of, for example, silicon (Si). The concave portion can be formed, for example, by etching silicon.

As shown in FIGS. 33 and 34, the MEMS layer ML has a mass body MS. Also, the MEMS layer ML has a fixed portion FU. The fixed portion FU is a portion sandwiched between a convex portion of the base layer BL and a convex portion of the cap CL to be described later. The mass body MS is disposed in the cavity CV. Incidentally, as shown in FIG. 34, a plurality of openings OP passing through the mass body MS may be provided in the mass body MS. In this example, the substantially rectangular openings OP are arranged in the mass body MS with eight openings at predetermined intervals in the vertical direction and 14 openings at predetermined intervals in the horizontal direction. In this way, the openings are provided in the mass body MS, thereby being capable of reducing air resistance and being capable of reducing mechanical noise. The MEMS layer ML is made of, for example, silicon (Si), and the processing of the MEMS layer ML can be performed, for example, by etching silicon. One end of the mass body MS is sandwiched between the convex portion of the base layer BL and the convex portion of the cap layer CL to be described later. The other end is not fixed, and displaceable in the z direction in FIGS. 33 and 34.

Further, since the mass body MS is made of silicon having conductivity and is displaceable in the z direction, the mass body MS also functions as the movable electrode VE. Therefore, in the acceleration sensor according to the present embodiment, a capacitance is formed by the fixed electrode FE formed on the base layer BL and the mass body MS (movable electrode VE) formed on the MEMS layer ML.

The cap layer CL has a concave portion to be the cavity CV. The convex portion at an end (the left end in FIG. 33) of the concave portion is a portion to be bonded to the fixed portion FU of the mass body MS. Also, the cap CL layer has a fixed electrode FE. The fixed electrode FE is disposed at the bottom of the concave portion to be the cavity CV. Incidentally, since the cap layer CL is adhered to the MEMS layer ML such that the concave portion faces downward, the fixed electrode FE is disposed on the upper surface side of the acceleration sensor.

As shown in FIGS. 32 and 33, the fixed electrode FE is surrounded by the through hole TH1 and is electrically isolated from the other region. The insulating film IF1 is buried at both sides of the through hole TH1 and the polysilicon P is buried inside the insulating film IF1.

In this example, as shown in FIG. 32, a width of the through hole TH1 is not even and has a wide portion (singular point) WP in a part thereof. Specifically, the wide portion WP of the through hole TH1 has a width "WTH1W", and in other parts, the through hole TH1 has a width "WTH1", and there is a relationship of WTH1W>WTH1.

For that reason, in the through hole TH1, in the region other than the wide portion WP, the inside of the through hole TH1 is filled with the insulating film IF1 and the polysilicon P, whereas in the wide portion WP, a gap (airway) SP is disposed inside the polysilicon P. Therefore, in the cross section of the through hole TH1, the insulating film IF1, the polysilicon P, the polysilicon P, and the insulating film IF1 are disposed in the stated order from one side. On the contrary, in the cross section of the wide portion WP of the through hole TH1, the insulating film IF1, the polysilicon P, the gap SP, the polysilicon P, and the insulating film IF1 are disposed in the stated order.

An interlayer insulating film IL1 is disposed on the fixed electrode FE surrounded by the through hole TH1. A part of the interlayer insulating film IL1 enters the gap SP of the wide portion WP. In other words, the gap SP of the wide portion WP is filled with the interlayer insulating film IL1.

[Description of Operation]

In the acceleration sensor according to the present embodiment, as in the case of the first embodiment, the acceleration applied in the z direction is captured as a capacitance change of a variable capacitance formed by the movable electrode VE and the fixed electrode FE.

[Manufacturing Method]

The acceleration sensor according to the present embodiment can be formed in the same process as that in the first embodiment.

In other words, a concave portion serving as the cavity CV is provided in a silicon wafer serving as the base layer BL.

Subsequently, a silicon wafer to be the MEMS layer ML is bonded onto the base layer BL, thinned and patterned (refer to FIG. 34). As a result, a bonded substrate where the MEMS layer ML is formed on the base layer BL can be formed.

Next, the cap layer CL is formed, and the cap layer CL is bonded to the bonded substrate and sealed.

For example, a concave portion serving as the cavity CV is formed in a silicon wafer serving as the cap layer CL, and a trench serving as the through hole TH1 is formed in the bottom surface of the concave portion. The trench (through hole TH1) is formed in a substantially rectangular annular shape so as to surround an area in which a substantially rectangular fixed electrode FE is formed. The width of the trench (through hole TH1) is not even and has a wide portion WP in part (refer to FIG. 32).

Next, the insulating film IF1 is formed on the surface of the silicon wafer including the bottom surface and the side surface of the trench. As a result, the insulating film IF1 is formed on the bottom surface and the side surface of the trench. A trench having a width WTH2W is formed in the trench portion having the width WTH1W, and a trench having a width WTH2 is formed in the trench portion having the width WTH1. A relationship of the width WTH2 W>the width WTH2 is established.

Next, for example, polysilicon P is formed on the insulating film IF1 including the inside of the trench having the width WTH2W and the inside of the trench having the width WTH2. At this time, the film thickness of the polysilicon P is set to the degree that the trench portion having the width WTH2 is filled with the polysilicon P, but the trench portion having the width WTH2W is not filled with the polysilicon P. As a result, a gap (airway) SP which is not filled with the polysilicon P is formed in the trench portion having the width WTH2W.

Next, the polysilicon P and the insulating film IF1 on the surface of the silicon wafer are etched back through the etching technique.

The cap layer CL for bonding to the bonded substrate S1 is formed by the above process. Next, the bonded substrate S1 which is the substrate where the MEMS layer ML is formed on the base layer BL is bonded to the cap layer CL. In this situation, the inside of the chamber is put into a reduced pressure state (preferably a vacuum state) so that the inside of the cavity CV is filled with a gas having a pressure sufficiently lower than the atmospheric pressure.

Next, the back surface of the silicon wafer to be the cap layer CL is polished until the polysilicon P in the trench (through hole TH1) is exposed. In this situation, the gap (airway) SP in the trench is exposed by polishing. The gap (airway) SP becomes a leak path and the inside of the cavity CV becomes an atmospheric pressure. Also, due to the polishing, the fixed electrode FE is formed.

Next, the interlayer insulating film IL1 is formed on the upper surface of the bonded body after reducing the pressure in the cavity CV of the bonded body where the bonded substrate S1 and the cap layer CL are bonded together. First, the inside of the chamber is reduced in pressure (depressurizing process). Subsequently, the interlayer insulating film IL1 is formed on the upper surface of the bonded body (film forming process). For example, a silicon oxide film is formed as the interlayer insulating film IL1 by the CVD method. The interlayer insulating film IL1 is sequentially deposited on the upper surface of the bonded body when the film formation is started. In this case, the upper portion of the gap (airway) SP is covered with an interlayer insulating film IL1 (refer to the OH portion).

After forming the interlayer insulating film IL1, the bonded body is taken out from the chamber of the film forming apparatus and cooled down to room temperature. At this time, according to the Boil-Charles law, the inside of the cavity CV becomes higher vacuum. In other words, the pressure in the cavity CV becomes lower than a set pressure of the chamber at the time of film formation.

Next, a connection portion (PL1) is formed in the interlayer insulating film IL1 and a wiring (M1) is formed on the interlayer insulating film IL1. The acceleration sensor according to the present embodiment can be formed through the above processes.

As described above, also in the present embodiment, as described in the first embodiment, the airtightness in the cavity can be increased and the degree of airtightness can be adjusted by a simple process without obtaining a complicated process. As a result, the sensitivity of the acceleration sensor can be enhanced. In addition, variations in the sensitivity of the acceleration sensor can be reduced.

Also in the present embodiment, as described in the first embodiment, the film formation conditions are not limited to 50 Pa and 500° C., and other conditions may be used. For example, as the film formation conditions, the deposition pressure is Pr1, the film formation temperature is Te1, and the pressure (sealing pressure, product internal pressure) and the temperature (sealing temperature, operating temperature) after completion of the acceleration sensor are set as Pr2 and the film forming temperature Te2, respectively. When a ratio of the pressure and the temperature (pressure/temperature) are Pr1/Te1 and Pr2/Te2, Pr1/Te1 may be set in a range of Pr2/Te2≥Pr1/Te1 (except for Pr2=Pr1 and Te2=Te1) so as to satisfy the desired Pr2/Te2.

Similarly, in the present embodiment, as described in the application 1 of the second embodiment, the gap (airway) SP may be covered with a film (for example, polysilicon P2) different from the interlayer insulating film IL1.

Figure 35:
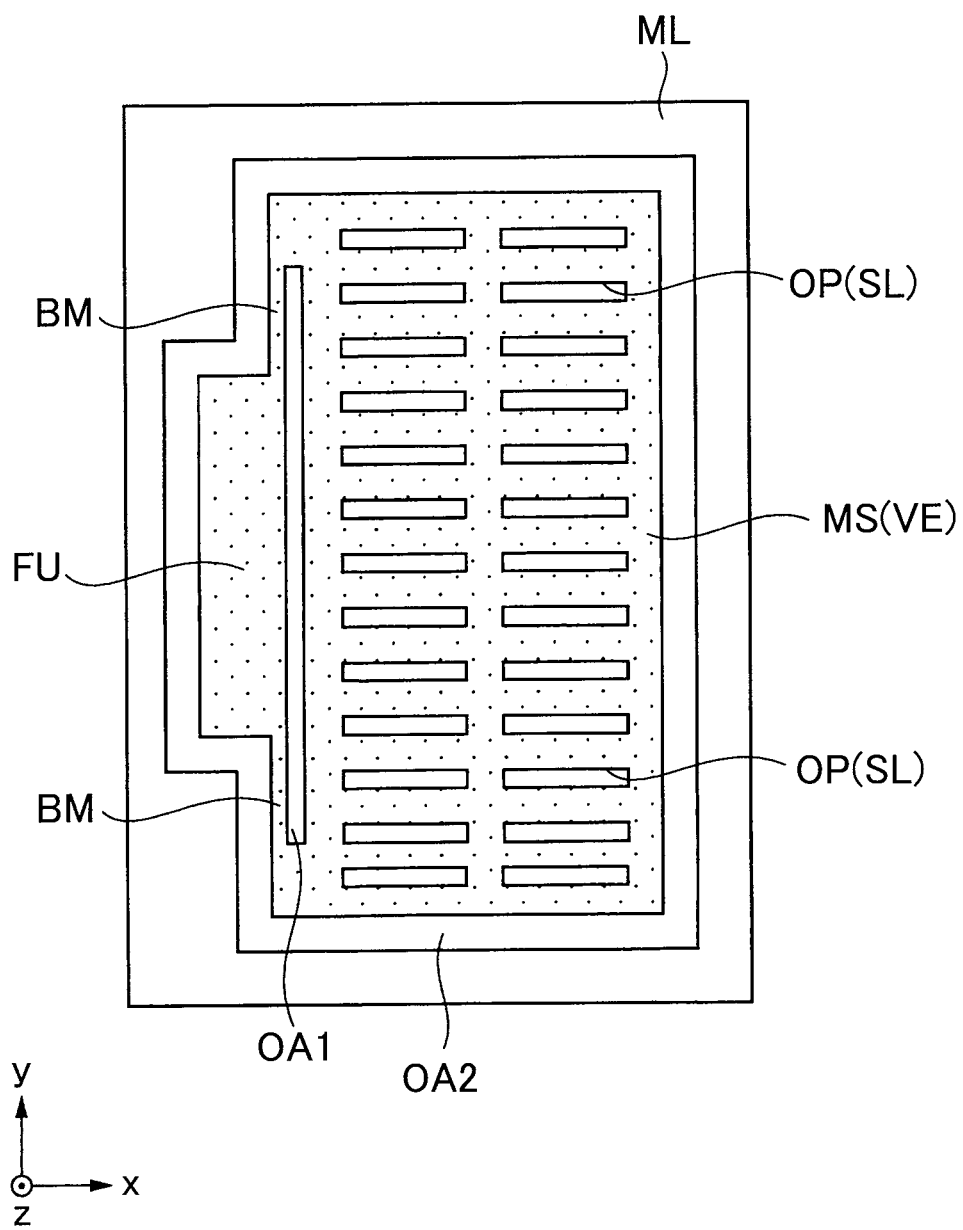
FIG. 35 is a plan view showing another configuration of the MEMS layer in the acceleration sensor according to the third embodiment.

In addition, in the mass body MS shown in FIG. 34, the fixed portion FU is provided along the short side of the substantially rectangular MEMS layer ML. However, the fixed portion FU may be formed along the long side of the substantially rectangular MEMS layer ML. Also, although the substantially rectangular opening OP is provided in the mass body MS shown in FIG. 34, a slit-like opening OP may be provided in the mass MS. FIG. 35 is a plan view showing another configuration of the MEMS layer of the acceleration sensor according to the present embodiment. FIG. 35 is a plan view of the MEMS layer ML as viewed from the top.

In FIG. 35, slit-shaped openings OP (SL) are arranged in the mass body MS at predetermined intervals with 13 slits in the vertical direction and two slits in the horizontal direction. In this way, the shape and dense of the openings can be appropriately changed (refer to FIG. 23).

Although the invention made by the present inventors has been specifically described based on the embodiments of the present invention, the present invention is not limited to the abovementioned embodiments, and various modifications can be made without departing from the spirit of the present invention. In the above embodiment, the TSV is formed after forming the concave portion serving as the cavity, but the concave portion serving as the cavity may be formed after forming the TSV.

In the above embodiments, the acceleration sensor has been described as the examples of the inertial sensor, but the configuration and the manufacturing method of the above embodiments can be applicable to, for example, an angular velocity sensor having a mass body and a fixed electrode.

LIST OF REFERENCE SIGNS

AS: acceleration sensor
BL: base layer
BUD1: boundary
BUD2: boundary
C: chamber
C1: connection hole
CL: cap layer
CV: cavity
CV1: cavity
CV2: cavity
FE: fixed electrode
FE1: fixed electrode
FE2: fixed electrode
FU: fixed unit
G1: trench GB: gate valve
GND: ground surface
H: resistance heater
IF1: insulating film
IL1: interlayer insulating film
M1: wiring
ML: MEMS layer
MS: mass body
MS1: mass body
MS2: mass body
OA1: opening
OA2: opening
OH: this overhang
OP: opening
OP1: opening
OP2: opening
P: polysilicon
PL1: connection portion
PU: vacuum pump
P2: polysilicon
S1: bonded substrate
SE: seam
SP: gap (airway)
TH1: through hole
TH2: through hole
VE: movable electrode
VE1: movable electrode
VE2: movable electrode
WP: wide portion
WTH1: width
WTH1W: width
WTH2: width
WTH2W: width

The invention claimed is:

1. An inertia sensor comprising:
   a first layer; and
   a third layer that is disposed over the first layer across a second layer,
   wherein the first layer has a first concave portion,
   wherein the second layer has a movable electrode,
   wherein the third layer has a second concave portion and a fixed electrode,
   wherein the movable electrode is disposed in a first cavity surrounded by the first concave portion and the second concave portion,
   wherein the fixed electrode is configured by a portion of the third layer which is surrounded by a through hole provided in the third layer, the through hole being formed between an inner wall surrounding the fixed electrode and an outer wall spaced from the inner wall and surrounding the inner wall,
   wherein the through hole has a portion in which the outer wall is spaced from the inner wall by a greater width to form a wide portion,
   wherein the inner wall and the outer wall of the through hole are covered with a first film, the first film covering the inner wall has a first film inner wall and the first film covering the outer wall has a first film outer wall, the first film outer wall being spaced from the first film inner wall by a first film space, and
   wherein the first film inner wall and the first film outer wall are covered by a second film so as to fill the first film space between the first film inner wall and the first film outer wall except in the wide portion where a gap is left open between the second film covering the first film inner wall and the second film covering the first film outer wall at the wide portion.

2. The inertia sensor according to claim 1,
   wherein the second film is disposed over the third layer, and
   the inertia sensor further comprises a wire that is formed over the second film.

3. The inertia sensor according to claim 1, further comprising:
   a third film that is formed over the second film in the gap and formed over the third layer, and
   a wire that is formed over the third film.

4. The inertia sensor according to claim 1, further comprising a plurality of openings that are provided in the movable electrode.

5. An inertia sensor, comprising:
   a first layer; and
   a third layer that is disposed over the first layer across a second layer,
   wherein the first layer has a first concave portion, a second concave portion, and a first convex portion between the first concave portion and the second concave portion,
   wherein the second layer has a first movable electrode, a second movable electrode, and a fixed portion between the first movable electrode and the second movable electrode,
   wherein the third layer has a third concave portion, a fourth concave portion, a second convex portion between the third concave portion and the fourth concave portion, a first fixed electrode, and a second fixed electrode,
   wherein the first movable electrode is disposed in a first cavity that is surrounded by the first concave portion and the third concave portion,
   wherein the second movable electrode is disposed in a second cavity that is surrounded by the second concave portion and the fourth concave portion,
   wherein the first fixed electrode is configured by a first portion of the third layer which is surrounded by a first through hole provided in the third layer, the first through hole being formed between a first inner wall surrounding the first fixed electrode and a first outer wall spaced from the first inner wall and surrounding the first inner wall,
   wherein the second fixed electrode is configured by a second portion of the third layer which is surrounded by a second through hole provided in the third layer, the second through hole being formed between a second inner wall surrounding the second fixed electrode and a second outer wall spaced from the second inner wall and surrounding the second inner wall,
   wherein at least one of (i) the first through hole has a portion in which the first outer wall is spaced from the first inner wall by a greater width to form a first wide portion or (ii) the second through hole has a portion in which the second outer wall is spaced from the second inner wall by another greater width to form a second wide portion, so as to form at least one wide portion,
   wherein the first inner wall and the first outer wall of the first through hole are covered with a first film, the first film covering the first inner wall has a first-film first-through-hole inner wall and the first film covering the first outer wall has a first-film first-through-hole outer wall, the first-film first-through-hole outer wall being spaced from the first-film first-through-hole inner wall by a first-film first-through-hole space,
   wherein the second inner wall and the second outer wall of the second through hole are covered with the first film, the first film covering the second inner wall has a first-film second-through-hole inner wall and the first film covering the second outer wall has a first-film second-through-hole outer wall, the first-film second-through-hole outer wall being spaced from the first-film second-through-hole inner wall by a first-film second-through-hole space, and wherein the first-film first-through-hole inner wall, the first-film first-through-hole outer wall, the first-film second-through-hole inner wall, and the first-film second-through-hole outer wall are covered by a second film, so as to fill (i) the first-film first-through-hole space between the first-film first-through-hole inner wall and the first-film first-through-hole outer wall and (ii) first-film second-through-hole space between the first-film second-through-hole inner wall and the first-film second-through-hole outer wall, except in the at least one wide portion where at least one gap is left open between the second film covering at least one of (i) the first-film first-through-hole inner wall and the second film covering the first-film first-through-hole outer wall at the first wide portion or (ii) the first-film second-through-hole inner wall and the second film covering the first-film second-through-hole outer wall at the second wide portion.

6. The inertia sensor according to claim 5,
wherein the second film is disposed over the third layer, and
the inertia sensor further comprises a wire that is formed over the second film.

7. The inertia sensor according to claim 5, further comprising:
a third film that is formed on the second film in the at least one gap and formed over the third layer; and
a wire that is formed on the third film.

8. The inertia sensor according to claim 5,
wherein a plurality of openings are provided in at least one of the first movable electrode and the second movable electrode.

9. The inertia sensor according to claim 5,
wherein the first movable electrode and the second movable electrode are different in mass from each other.

10. The inertia sensor according to claim 1,
wherein the first film comprises an insulating film.

11. The inertia sensor according to claim 10,
wherein the second film comprises a conductive film.

12. The inertia sensor according to claim 1,
wherein the gap is a through gap extending through a length of the through hole.

13. The inertia sensor according to claim 3,
wherein the third film comprises an insulating film.

14. The inertia sensor according to claim 13,
wherein the wire is connected to the third layer by a conductive connection portion extending through the third film.

15. The inertia sensor according to claim 4,
wherein the openings in the movable electrode are oriented in a direction between the first layer and the third layer.

16. The inertia sensor according to claim 5,
wherein the first film comprises an insulating film.

17. The inertia sensor according to claim 16,
wherein the second film comprises a conductive film.

18. The inertia sensor according to claim 5,
wherein the at least one gap is a through gap extending through a length of at least one of the first through hole or the second through hole.

19. The inertia sensor according to claim 7,
wherein the third film comprises an insulating film.

20. The inertia sensor according to claim 19,
wherein the wire is connected to the third layer by a conductive connection portion extending through the third film.

* * * * *